United States Patent
Kang et al.

(10) Patent No.: US 11,610,934 B2
(45) Date of Patent: Mar. 21, 2023

(54) LIGHT EMITTING DEVICE AND MANUFACTURING METHOD OF THE LIGHT EMITTING DEVICE

(71) Applicant: Samsung Display Co., Ltd., Yongin-si (KR)

(72) Inventors: Jong Hyuk Kang, Yongin-si (KR); Hyun Min Cho, Yongin-si (KR); Dae Hyun Kim, Yongin-si (KR); Joo Yeol Lee, Yongin-si (KR); Hyun Deok Im, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/395,999

(22) Filed: Aug. 6, 2021

(65) Prior Publication Data

US 2021/0366978 A1 Nov. 25, 2021

Related U.S. Application Data

(63) Continuation of application No. 16/881,788, filed on May 22, 2020, now Pat. No. 11,088,197, which is a
(Continued)

(30) Foreign Application Priority Data

Dec. 19, 2016 (KR) .......................... 10-2016-0173864

(51) Int. Cl.
*H01L 27/15* (2006.01)
*H01L 33/00* (2010.01)
(Continued)

(52) U.S. Cl.
CPC ................ *H01L 27/15* (2013.01); *F21K 9/68* (2016.08); *H01L 25/0753* (2013.01);
(Continued)

(58) Field of Classification Search
None
See application file for complete search history.

(56) References Cited

U.S. PATENT DOCUMENTS

| | | | |
|---|---|---|---|
| 7,947,989 | B2 | 5/2011 | Ha et al. |
| 8,120,587 | B2 | 2/2012 | Kim et al. |
| (Continued) | | | |

FOREIGN PATENT DOCUMENTS

| | | |
|---|---|---|
| CN | 102042540 | 5/2011 |
| CN | 102099918 | 6/2011 |
| (Continued) | | |

OTHER PUBLICATIONS

Non-Final Office Action dated Jul. 26, 2018, issued in the U.S. Appl. No. 16/018,054.
(Continued)

*Primary Examiner* — Vip Patel
(74) *Attorney, Agent, or Firm* — Kile Park Reed & Houtteman PLLC

(57) ABSTRACT

A light-emitting device includes: a substrate; a unit light-emitting area disposed on the substrate; first and second electrodes disposed in the unit light-emitting area to be separated from each other; a plurality of rod-shaped LEDs disposed between the first and second electrodes; a reflective contact electrode disposed on opposite ends of the rod-shaped LEDs to electrically connect the rod-shaped LEDs to the first and second electrodes; and a light-transmitting structure disposed between the first and second electrodes and extending to cross the rod-shaped LEDs.

14 Claims, 15 Drawing Sheets

Related U.S. Application Data continuation of application No. 16/389,200, filed on Apr. 19, 2019, now Pat. No. 10,665,633, which is a continuation of application No. 16/018,054, filed on Jun. 26, 2018, now Pat. No. 10,269,865, which is a continuation of application No. 15/701,455, filed on Sep. 12, 2017, now Pat. No. 10,026,777.

(51) Int. Cl.
| | | |
|---|---|---|
| *H01L 33/40* | (2010.01) | |
| *F21K 9/68* | (2016.01) | |
| *H01L 25/075* | (2006.01) | |
| *H01L 33/60* | (2010.01) | |
| *H01L 33/62* | (2010.01) | |

(52) U.S. Cl.
CPC .......... *H01L 33/005* (2013.01); *H01L 33/405* (2013.01); *H01L 33/60* (2013.01); *H01L 33/62* (2013.01)

(56) References Cited

U.S. PATENT DOCUMENTS

| | | | |
|---|---|---|---|
| 8,138,493 B2 | 3/2012 | Ohlsson et al. | |
| 8,872,214 B2 | 10/2014 | Negishi et al. | |
| 9,018,669 B2* | 4/2015 | Seo | H01L 33/20 257/79 |
| 9,287,242 B2 | 3/2016 | Shibata et al. | |
| 9,329,433 B2 | 5/2016 | Negishi et al. | |
| 10,910,512 B2 | 2/2021 | Sung | |
| 2010/0133529 A1 | 6/2010 | Taraschi et al. | |
| 2011/0089850 A1 | 4/2011 | Shibata et al. | |
| 2011/0204327 A1 | 8/2011 | Hiruma et al. | |
| 2012/0025232 A1 | 2/2012 | Gwo et al. | |
| 2012/0329182 A1* | 12/2012 | Kojio | H01L 24/75 257/E33.059 |
| 2015/0194572 A1* | 7/2015 | Kwon | H01L 33/52 257/98 |
| 2016/0148911 A1 | 5/2016 | Do | |
| 2016/0307879 A1 | 10/2016 | Lien et al. | |

FOREIGN PATENT DOCUMENTS

| | | |
|---|---|---|
| CN | 102792467 | 11/2012 |
| CN | 104051589 | 9/2014 |
| CN | 106067463 | 11/2016 |
| EP | 2 665 100 | 11/2013 |
| JP | 2012-94885 | 5/2012 |
| KR | 10-2004-0056441 | 7/2004 |
| KR | 10-2006-0124833 | 12/2006 |
| KR | 10-2009-0131171 | 12/2009 |
| KR | 10-1264159 | 5/2013 |
| WO | 2012/172986 | 12/2012 |
| WO | 2016/080712 | 5/2016 |

OTHER PUBLICATIONS

Notice of Allowance dated Dec. 7, 2018, issued in the U.S. Appl. No. 16/018,054.
Notice of Allowance dated Mar. 28, 2018, issued in the U.S. Appl. No. 15/701,455.
Chinese Office Action for Chinese Patent Application or Patent No. 201711318223.2, dated Mar. 18, 2022.

* cited by examiner

LIGHT EMITTING DEVICE AND MANUFACTURING METHOD OF THE LIGHT EMITTING DEVICE

CROSS-REFERENCE TO RELATED APPLICATION(S)

This is a continuation application of U.S. patent application Ser. No. 16/881,788, filed May 22, 2020 (now pending), the disclosure of which is incorporated herein by reference in its entirety. U.S. patent application Ser. No. 16/881,788 is a continuation application of U.S. patent application Ser. No. 16/389,200, filed Apr. 19, 2019, now U.S. Pat. No. 10,665,633, issued May 26, 2020, the disclosure of which is herein by reference in its entirety. U.S. patent application Ser. No. 16/389,200 is a continuation application of U.S. patent application Ser. No. 16/018,054, filed Jun. 26, 2018, now U.S. Pat. No. 10,269,865, issued Apr. 23, 2019, the disclosure of which is herein by reference in its entirety. U.S. patent application Ser. No. 16/018,054 is a continuation application of U.S. patent application Ser. No. 15/701,455, filed Sep. 12, 2017, now U.S. Pat. No. 10,026,777, issued Jul. 17, 2018, the disclosure of which is herein by reference in its entirety. U.S. patent application Ser. No. 15/701,455 claims priority benefit of Korean Patent Application No. 10-2016-0173864 under 35 U.S.C. § 119, filed on Dec. 19, 2016, the disclosure of which is incorporated herein by reference in its entirety for all purposes.

BACKGROUND

Field

Exemplary embodiments of the inventive concepts relate to a light-emitting device and a manufacturing method of the light-emitting device.

Discussion of the Background

Light emitting diodes (hereinafter abbreviated as "LEDs") exhibit relatively good durability even under adverse environmental conditions, and have excellent performance in terms of lifetime and luminance. In recent years, research has been conducted for apply LEDs to various light-emitting devices.

As a part of the research, techniques for fabricating ultra-small rod-shaped LEDs, such as to a microscale or nanoscale degree using an inorganic crystal structure, for example, a structure in which a nitride-based semiconductor is grown, are being developed. For example, the rod-shaped LED may be manufactured to a size small enough to form a pixel of the self-luminous display panel.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a light-emitting device including rod-shaped LEDs and having a uniform light-emitting characteristic, and a manufacturing method of the light-emitting device.

Additional aspects will be set forth in the detailed description which follows, and, in part, will be apparent from the disclosure, or may be learned by practice of the inventive concept.

According to exemplary embodiments, a light-emitting device includes: a substrate; a unit light-emitting area disposed on the substrate; first and second electrodes disposed in the unit light-emitting area to be separated from each other; a plurality of rod-shaped LEDs disposed between the first and second electrodes; a reflective contact electrode disposed on opposite ends of the rod-shaped LEDs to electrically connect the rod-shaped LEDs to the first and second electrodes; and a light-transmitting structure disposed between the first and second electrodes and extending to cross the rod-shaped LEDs.

In some exemplary embodiments, the light-transmitting structure may be disposed to overlap at least a center part of the rod-shaped LEDs, and to protrude above and below the rod-shaped LEDs in a direction crossing the plane in which the substrate is disposed such that light emitted from the rod-shaped LEDs is transmitted toward the front of the substrate.

In some exemplary embodiments, the first and second electrodes may be disposed to be separated from each other in at least one region of the unit light-emitting area, and the light-transmitting structure may extend between the first and second electrodes in a direction parallel to the first and second electrodes to overlap the plurality of rod-shaped LEDs.

In some exemplary embodiments, the contact electrode may include: a first contact electrode to which the first electrode and one end of the rod-shaped LEDs are connected; and a second contact electrode to which the second electrode and the other end of the rod-shaped LEDs are connected.

In some exemplary embodiments, the contact electrode may include at least one metal layer including at least one of Ag, Cu, Ti/Al/Ti, ITO/Ag/ITO, and Mo/Al/Mo.

In some exemplary embodiments, the light-transmitting structure may include at least one of a silicon oxide ($SiO_x$), a silicon nitride ($SiN_x$), and a silicone resin that includes scatterers.

In some exemplary embodiments, the scatterers may include at least one of $TiO2$ and $SiO2$.

In some exemplary embodiments, the light-transmitting structure may have an inclined side surface, the width of which gradually decreases closer to the substrate.

In some exemplary embodiments, the light-transmitting structure may have a top surface that protrudes above the rod-shaped LEDs, and the top surface may have an uneven surface.

In some exemplary embodiments, the light-transmitting structure may have a width that gradually decreases from a lower part adjacent to the substrate to an upper part distant from the substrate, and may have a curved side surface.

In some exemplary embodiments, a plurality of pixels disposed on the substrate may be included, and each pixel may include at least one unit light-emitting area.

In some exemplary embodiments, the rod-shaped LEDs may respectively include an insulating film that exposes at least the opposite ends and encloses a side surface, and the exposed opposite ends may be respectively positioned on the first electrode and the second electrode.

In some exemplary embodiments, the light-transmitting structure may have a lower refractive index than the rod-shaped LEDs.

An exemplary embodiment of a manufacturing method of a light-emitting device includes: providing first and second electrodes on a substrate; providing a plurality of rod-shaped LEDs onto the substrate on which the first and second electrodes are disposed, and aligning the rod-shaped LEDs between the first and second electrodes; providing, between the first and the second electrodes, a light-transmitting structure that exposes the opposite ends of the rod-shaped LEDs and crosses the rod-shaped LEDs; and providing a reflective contact electrode electrically connecting the opposite ends of the rod-shaped LEDs to the first and second electrodes, respectively.

In some exemplary embodiments, the providing of the light-transmitting structure may include: providing a light-transmissive insulating layer onto the substrate on which the rod-shaped LEDs are aligned; and patterning the insulating layer by a photo process using a mask to provide the light-transmitting structure.

In some exemplary embodiments, the insulating layer may be disposed above the height of the rod-shaped LEDs.

In some exemplary embodiments, the insulating layer may be patterned to have an inclined side surface that has a reverse taper shape between the first and second electrodes.

In some exemplary embodiments, the manufacturing method may further include providing uneven patterns at a top surface of the insulating layer or the light-transmitting structure.

In some exemplary embodiments, the providing of the light-transmitting structure may include: applying a liquid organic insulating material between the first and second electrodes to expose the opposite ends of the rod-shaped LEDs; and hardening the organic insulating material.

In some exemplary embodiments, in the applying of the organic insulating material, a liquid organic insulating material in which scatterers are distributed may be applied above the height of the rod-shaped LEDs.

According to various exemplary embodiments of the inventive concepts, a light-emitting device that includes a plurality of rod-shaped LEDs disposed in each unit light-emitting area and uniformly emits light in the respective unit light-emitting areas, a manufacturing method of the light-emitting device may be provided.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
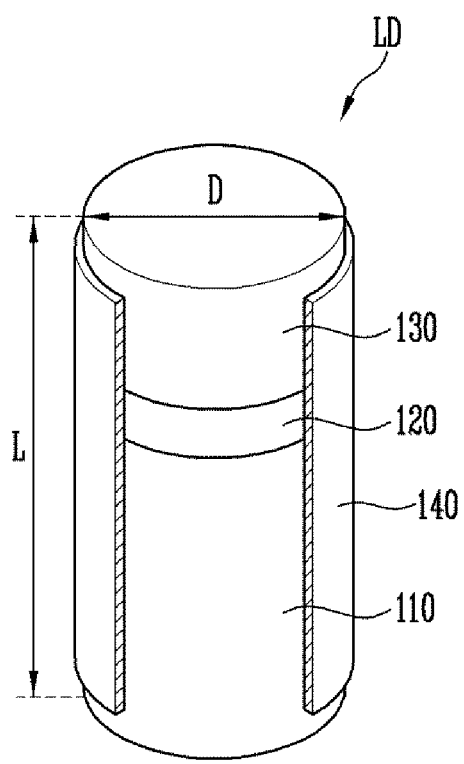
FIG. 1 illustrates a rod-shaped LED according to an exemplary embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not necessarily intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view of a rod-shaped LED LD according to an exemplary embodiment of the inventive concepts. In some embodiments, the rod-shaped LED LD having a cylinder shape is shown in FIG. 1, but the shape of the rod-shaped LED LD according to the inventive concepts is not limited thereto.

Referring to FIG. 1, the rod-shaped LED LD according to the current exemplary embodiment inventive concepts includes: first and second conductive semiconductor layers 110 and 130; and active layer 120 interposed between the first and second conductive semiconductor layers 110 and 130. For example, the rod-shaped LED LD may be implemented as a layered body in which the first conductive semiconductor layer 110, the active layer 120, and the second conductive semiconductor layer 130 are sequentially layered. In addition, in some embodiments, the rod-shaped LED LD may further include an insulating film 140, and in addition to the insulating film 140, may further include one or more electrode layers.

In the current exemplary embodiment of the inventive concepts, the rod-shaped LED LD may be provided to have a rod-like (or bar-like) shape that extends along one direction. Assuming that the extending direction of the rod-shaped LED LD is a length L in a first direction, the rod-shaped LED LD has a first end portion (or "first end") and a second end portion or "second end") extending along a second direction. In the current exemplary embodiment, one of the first and second conductive semiconductor layers 110 and 130 are disposed in the first end portion, while the other of the first and second conductive semiconductor layers 110 and 130 are disposed in the second end portion. On the other hand, in another exemplary embodiment, when at least one electrode layer is further disposed at least one end of the rod-shaped LED LD, an electrode layer (not shown) may also be disposed in at least one of the first end portion and the second end portion.

In some exemplary embodiments, the rod-shaped LED LD may be provided to have a cylinder shape as shown in FIG. 1, but the shape of the rod-shaped LED LD is not limited thereto. In this case, "rod-shaped" includes a rod-like shape which has a length L along the first direction (i.e., the aspect ratio is larger than 1), such as a cylinder, a polygonal column, or the like, or a bar-like shape. For example, the rod-shaped LED LD may have a length L that is greater than the diameter D.

The rod-shaped LED LD may be manufactured small, for example, enough to have a diameter D and/or length L on a microscale or nanoscale. For example, the rod-shaped LED LD may have a diameter D in a range of tens of nanometers (nm) to several micrometers (μm), and a length L in a range of hundreds of nanometers (nm) to tens of micrometers (μm). However, the size of the rod-shaped LED LD according to the current embodiment of the inventive concepts is not necessarily limited thereto. For example, the size of the rod-shaped LED LD may be modified to meet the requirements of the light-emitting device to which the rod-shaped LED LD is applied.

The first conductive semiconductor layer 110 may include, for example, at least one n-type semiconductor layer. For example, the first conductive semiconductor layer 110 may include any semiconductor material selected from InAlGaN, GaN, AlGaN, InGaN, AlN, and InN, and may include a semiconductor layer doped with a first conductive dopant such as Si, Ge, Sn, or the like. Materials for forming the first conductive semiconductor layer 110 are not limited thereto, and in addition, the first conductive semiconductor layer 110 may be made of a variety of materials.

The active layer 120 is disposed above the first conductive semiconductor layer 110, and may be formed to have a single or multiple quantum well structures. In some exemplary embodiments, a clad layer (not shown) doped with a conductive dopant may also be formed above and/or below the active layer 120. For example, the clad layer may be implemented as an AlGaN layer or an InAlGaN layer. In addition, materials such as AlGaN, AlInGaN, or the like may also be used as the active layer 120. When an electric field corresponding to a predetermined voltage or above is applied to opposite ends of the rod-shaped LED LD, electron-hole pairs are combined in the active layer 120, thereby causing the rod-shaped LED LD to emit light.

The second conductive semiconductor layer 130 is disposed above the active layer 120, and may include a semiconductor layer that is different from the first conductive semiconductor layer 110. For example, the second conductive semiconductor layer 130 may include at least one p-type semiconductor layer. For example, the second conductive semiconductor layer 130 includes at least one semiconductor material selected from InAlGaN, GaN, AlGaN, InGaN, AlN, and InN, and may include a semiconductor layer doped with the second conductive dopant such as Mg or the like. Materials for forming the second conductive semiconductor layer 130 are not limited thereto, and in addition, the second conductive semiconductor layer 130 may be made of a variety of materials.

Further, in some exemplary embodiments, in addition to the first conductive semiconductor layer 110, the active layer 120, and the second conductive semiconductor layer 130 that are described above, the rod-shaped LED LD may further include other phosphor layers, active layers, semiconductor layers and/or electrode layers above and/or below each layer. For example, the rod-shaped LED LD may further include a first and/or second electrode layer that is disposed in at least one end portion. For example, the first electrode layer is disposed at one end of the rod-shaped LED LD that is not covered by the insulating film 140 (e.g., at a bottom surface of the rod-shaped LED LD that is not covered by insulating film 140 in FIG. 1), and the second electrode layer may be disposed at the other end of the rod-shaped LED LD that is not covered by the insulating film 140 (e.g., at a top surface of the rod-shaped LED LD that is not covered by the insulating film 140 in FIG. 1).

In some exemplary embodiments, the rod-shaped LED LD may further include the insulating film 140, but it is not limited thereto. That is, in some exemplary embodiments, the insulating film 140 may be selectively included.

The insulating film 140 may be disposed to cover at least one region of the first conductive semiconductor layer 110, the active layer 120, and the second conductive semiconductor layer 130. For example, the insulating film 140 may be disposed in a portion where the opposite end portions of the rod-shaped LED LD are not present, thereby causing he opposite end portions of the rod-shaped LED LD to be exposed. For better understanding and ease of description, a part of the insulating film 140 is omitted in FIG. 1. For example, because a part of the insulating film 140 is omitted in FIG. 1, the first conductive semiconductor layer 110, the active layer 120, and the second conductive semiconductor layer 130 are partially exposed. However, actually, a side surface of the cylinder of the rod-shaped LED LD may all be surrounded by the insulating film 140. Further, in some exemplary embodiments, the insulating film 140 may also expose at least one region of the side surface of the first conductive semiconductor layer 110 and/or the second conductive semiconductor layer 130, for example, an upper end and/or a lower end of the side surface of the rod-shaped LED LD.

The insulating film 140 may be formed to enclose at least some of external circumferential surfaces of the first conductive semiconductor layer 110, the active layer 120 and/or the second conductive semiconductor layer 130. For example, the insulating film 140 may be formed to enclose at least the external circumferential surface of the active layer 120. In some exemplary embodiments, the insulating film 140 may be formed of a light-transmissive insulating material through which light can be transmitted, i.e., a transparent insulating material. For example, the insulating film 140 may include at least one or more insulating materials selected from $SiO_2$, $Si_3N_4$, $Al_2O_3$, and $TiO_2$, but it is not limited thereto. That is, in addition to the insulating material presented above, the insulating film 140 may be manufactured using various transparent insulating materials.

In an exemplary embodiment related to the insulating film 140, the insulating film 140 itself may be made of a hydrophobic material, or a hydrophobic coating, which is made of a hydrophobic material, may further be disposed on the insulating film 140. In some exemplary embodiments, a hydrophobic material may be a fluorine-containing material to represent a hydrophobic property. Further, in some embodiments, a hydrophobic material may be applied to the rod-shaped LED LD in the form of a self-assembled monolayer (self-assembled monolayer; SAM), and in this case, may include octadecyltrichlorosilane and fluoroalkyltrichlorosilane, perfluoroalkyltriethoxysilane, and the like. In addition, a hydrophobic material may be a commercially available fluorine-containing material such as TEFLON (Teflon™) or cytop (Cytop™), or may be a material corresponding thereto.

When the insulating film 140 is disposed (or formed), the active layer 120 may be prevented from being short-circuited with the first and/or second electrode that is not shown. In addition, surface defects of the rod-shaped LED LD can be minimized by forming the insulating film 140 such that the life-span and efficiency can be improved. In addition, when a plurality of rod-shaped LEDs LD are closely disposed, the insulating film 140 may prevent the undesired short-circuit that can be generated between the rod-shaped LEDs LD.

Additionally, if the insulating film 140 itself is made of a hydrophobic material, a hydrophobic coating is disposed on the insulating film 140, the rod-shaped LEDs LD may be relatively uniformly dispersed in the LED solution when applying an LED solution including a plurality of rod-shaped LEDs LD. Accordingly, the rod-shaped LEDs LD may be uniformly applied to the inside of each unit area that forms the light-emitting device.

The rod-shaped LED LD may be used as a light-emitting source of the various light-emitting devices. For example, the rod-shaped LED LD may be used as a light-emitting source of a lighting device or a self-emissive display panel.

Figure 2:
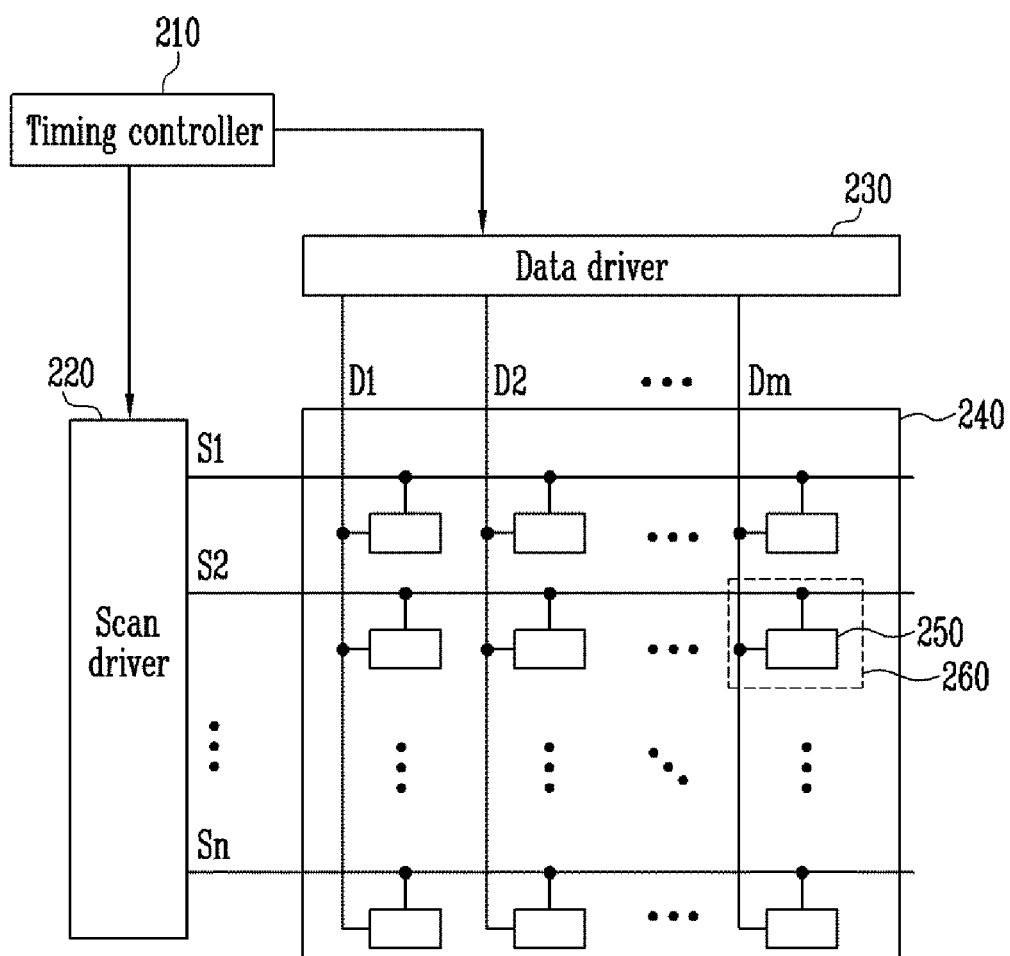
FIG. 2 is a view illustrating a configuration diagram of a light-emitting device according to an exemplary embodiment of the inventive concepts.

FIG. 2 is a configuration diagram of a light-emitting device according to an exemplary embodiment of the inventive concepts. In some exemplary embodiments, the light-emitting display device is shown in FIG. 2 as an example of the light-emitting device using the rod-shaped LED LD, but the light-emitting device according to the inventive concepts is not limited thereto. For example, the light-emitting device according to exemplary embodiments of the inventive concepts may be other types of light-emitting devices such as a lighting device and the like.

Referring to FIG. 2, the light-emitting device according to the current exemplary embodiment inventive concepts includes a timing controller 210, a scan driver 220, a data driver 230, and an emission area 240. When the light-emitting device is a light-emitting display device as in the current exemplary embodiment, the emission area 240 may represent the entire pixel area that is implemented on the display panel, i.e., the display area.

The timing controller 210 receives, from the outside (e.g., the system for sending image data), various kinds of control signals and image data required for driving the emission area 240. The timing controller 210 realigns the received image data to transmit it to the data driver 230. In addition, the timing controller 210 generates scan control signals and data control signals required for driving the scan driver 220 and the data driver 230, and respectively transmits the generated scan control signals and the data control signals to the scan driver 220 and the data driver 230.

The scan driver 220 receives the scan control signal from the timing controller 210, and generates a scan signal according to the scan control signal. The scan signal generated from the scan driver 220 is provided to unit areas (e.g., pixels) 260 via scan lines S1 to Sn.

The data driver 230 receives the data control signal and the image data from the timing controller 210, and correspondingly generates a data signal. The data signal generated from the data driver 230 is outputted to data lines D1 to Dm. The data signal outputted to the data lines D1 to Dm is inputted to the unit areas (e.g., the pixels) 260 of the horizontal pixel line that is selected by the scan signal.

The emission area 240 may include a plurality of unit areas 260 disposed in a region where the scan lines S1 to Sn and the data lines D1 to Dm cross each other. In some exemplary embodiments, each of the unit areas 260 may be the pixels 250 of the light-emitting display device.

The respective pixels 250 may include a plurality of rod-shaped LEDs LD as shown in FIG. 1. When the scan signal is provided from the scan lines Si to Sn, the pixels 250 selectively emits light according to the data signal received from the data lines D1 to Dm. For example, for each frame period of the light-emitting display device, the pixels 250 emit light with luminance corresponding to the received data signal. The pixel 250 to which the data signal corresponding to black luminance is provided to display black by not emitting light for the corresponding frame period. On the other hand, when the emission area 240 is a pixel area of an active-matrix type of light-emitting display panel, the emission area 240 may be further provided with the first and second pixel power in addition to the scan signal and the data signal. In some exemplary embodiments, the first and second pixel power may be a high-potential pixel power source ELVDD and a low-potential pixel power source ELVSS, respectively.

FIGS. 3A to 3E are circuit diagrams of a unit area 260 of a light-emitting device according to exemplary embodiments of the inventive concepts, particularly circuit diagrams of examples of a pixel forming a passive light-emitting display panel. For ease of description, the j-th (j is a natural number) pixel (i.e., the pixel disposed at the i-th row and the j-th column) on the i-th (i is a natural number) horizontal pixel line will be shown in FIGS. 3A to 3E. In some exemplary embodiments, the pixel shown in FIG. 3A to FIG. 3E may be one of red, green, blue, and white pixels, but it is not limited thereto.

Figure 3A:
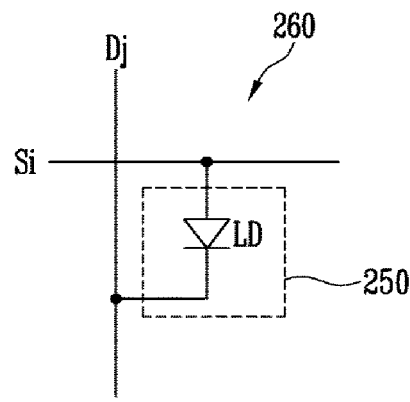
FIG. 3A, FIG. 3B, FIG. 3C, FIG. 3D, and FIG. 3E are views illustrating circuit diagrams of a unit area of the light-emitting device according to exemplary embodiments of the inventive concepts, particularly circuit diagrams of examples of a pixel forming a passive light-emitting display panel.

Referring to FIG. 3A, the pixel 250 includes a rod-shaped LED LD that is connected between a scan line Si and a data line Dj. In some exemplary embodiments, a first electrode (e.g., anode) of the rod-shaped LED LD may be connected to the scan line Si, and a second electrode (e.g., cathode) may be connected to the data line Dj. When a voltage higher than the threshold voltage is applied between the first electrode and the second electrode, the rod-shaped LED LD emits light with luminance corresponding to the magnitude of the applied voltage. That is, emission of the pixel 250 may be controlled by controlling the voltages of the scan signal applied to the scan line Si and/or the data signal applied to the data line Dj.

Figure 3B:
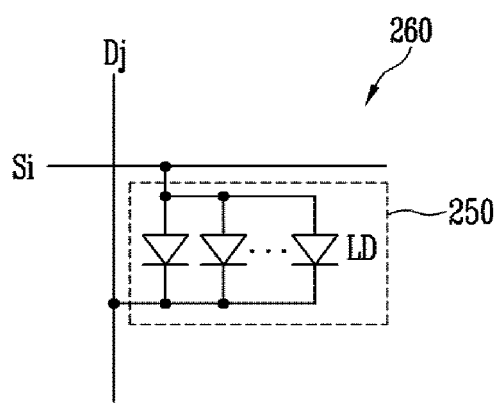

Referring to FIG. 3B, in some exemplary embodiments, the pixel 250 may include two or more rod-shaped LEDs LD that are connected in parallel. In this case, luminance of the pixel 250 may correspond to the sum of the brightness of a plurality of rod-shaped LEDs LD. As described above, when the pixel 250 includes the plurality of rod-shaped LEDs LD, particularly a large number of rod-shaped LEDs LD, even if some of the rod-shaped LEDs LD are defective, such a defect may not cause the pixel 250 to be defective.

Figure 3C:
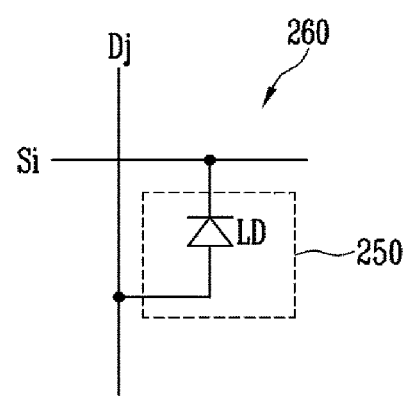

Referring to FIG. 3C, in some exemplary embodiments, the connection direction of the rod-shaped LED LD included in the pixel 250 may be changed. For example, the first electrode (anode) of the rod-shaped LED LD may be connected to the data line Dj, and the second electrode (cathode) thereof may be connected to the scan line Si. In the exemplary embodiment of FIG. 3A and the exemplary embodiment of FIG. 3C, voltages applied between the scan line Si and the data line Dj may be opposite to each other.

Figure 3D:
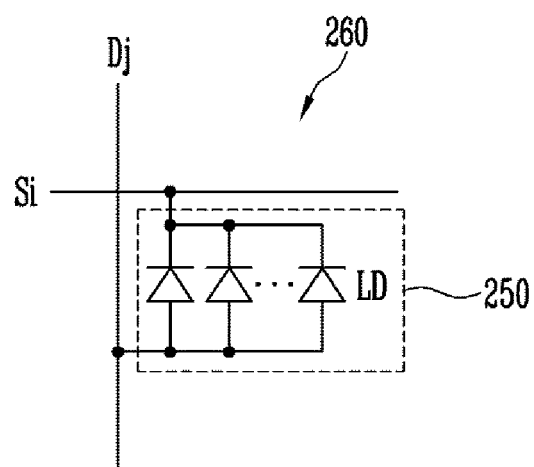

Referring to FIG. 3D, the pixel 250 according to the exemplary embodiment of FIG. 3C may also include two or more rod-shaped LEDs LD that are connected parallel to each other.

Figure 3E:
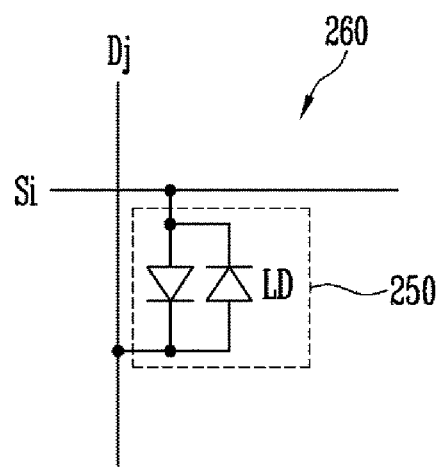

Referring to FIG. 3E, in some exemplary embodiments, the pixel 250 may include a plurality of rod-shaped LEDs LD connected in different directions. For example, the pixel 250 may include one or more rod-shaped LEDs LD in which the first electrode (anode) is connected to the scan line Si and the second electrode (cathode) is connected to the data line Dj, and one or more rod-shaped LEDs LD in which the first electrode (anode) is connected to the data line Dj and the second electrode (cathode) is connected to the scan line Si.

In some exemplary embodiments, the pixel 250 of FIG. 3E may be DC-driven or AC-driven. When the pixel 250 of FIG. 3E is DC-driven, the forward-connected rod-shaped LEDs LD may emit light, while the backward-connected rod-shaped LEDs LD may not emit light. On the other hand, when the pixel 250 of FIG. 3E is AC-driven, the rod-shaped LED LD forward-connected according to the direction of the applied voltage emits light. That is, when AC-driven, the rod-shaped LEDs LD included in the pixel 250 of FIG. 3E may alternately emit light according to the directions of the voltage.

Figure 4A:
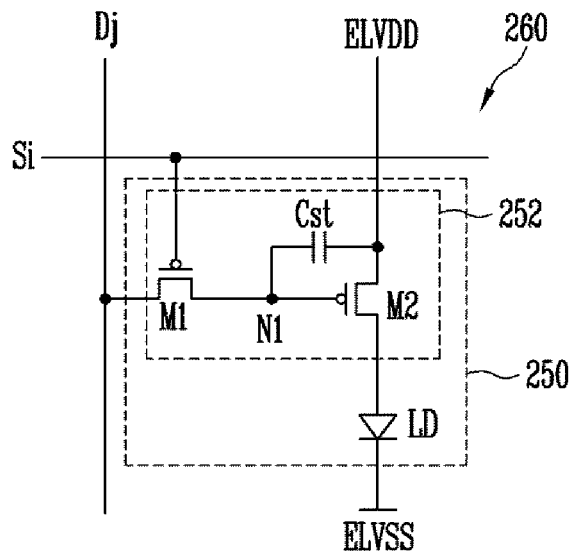
FIG. 4A, FIG. 4B, and FIG. 4C are views illustrating circuit diagrams of the unit area of the light-emitting device according to exemplary embodiments of the inventive concepts, particularly circuit diagrams of examples of a pixel forming an active light-emitting display panel.
Figure 4B:
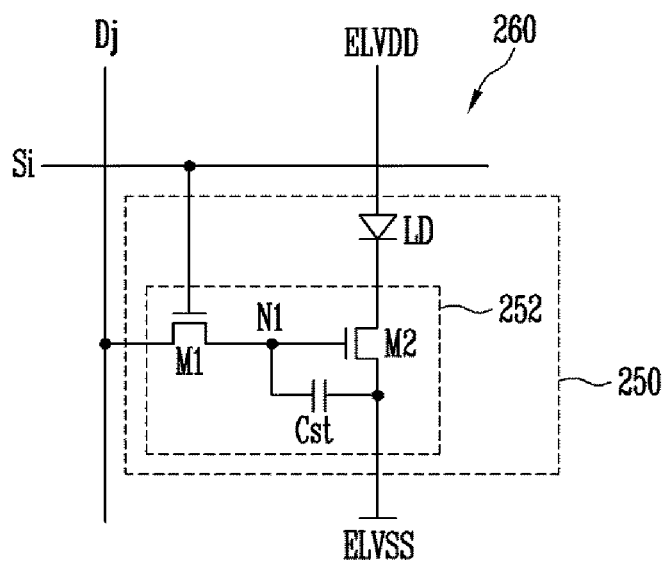
Figure 4C:
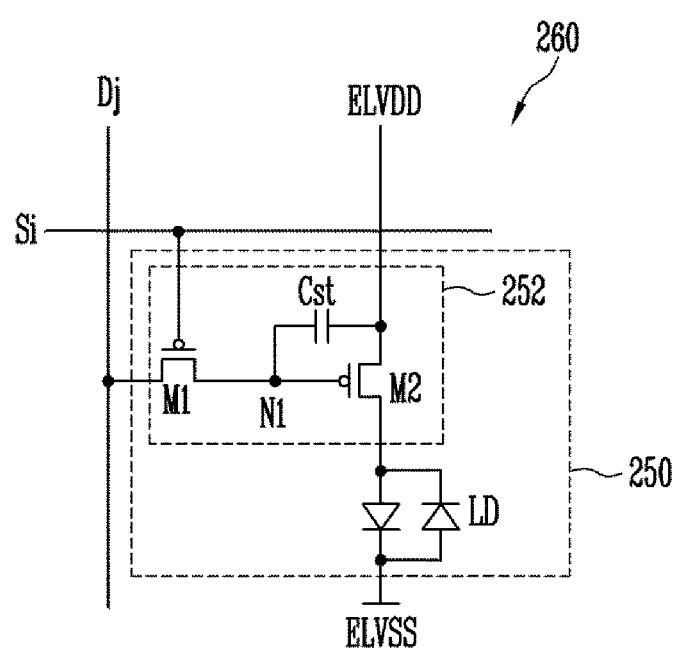

FIGS. 4A to 4C are circuit diagrams of a unit area 260 of a light-emitting device according to exemplary embodiments of the inventive concepts, particularly showing circuit diagrams of examples of a pixel forming an active-matrix light-emitting display panel. In FIGS. 4A to 4C, the same or similar components in FIG. 3A to FIG. 3E are denoted by the same reference numerals, and a detailed description thereof will be omitted.

Referring to FIG. 4A, the pixel 250 includes one or more rod-shaped LEDs LD, and a pixel circuit 252 connected thereto.

A first electrode (e.g., anode) of the rod-shaped LED LD is connected to a first pixel power source ELVDD via the pixel circuit 252, and a second electrode (e.g., cathode) is connected to a second pixel power source ELVSS. The first pixel power source ELVDD and the second pixel power source ELVSS may have different potentials. For example, the second pixel power source ELVSS may have a potential that is lower than that of the first pixel power source ELVDD by more than a threshold voltage of the rod-shaped LED LD. Each rod-shaped LED LD emits light with luminance corresponding to a driving current controlled by the pixel circuit 252.

On the other hand, in FIG. 4A, the exemplary embodiment in which only one rod-shaped LED LD is included in the pixel 250 is disclosed, but the inventive concepts are not limited thereto. For example, the pixel 250 may include a plurality of rod-shaped LEDs LD that are connected parallel to each other.

In some exemplary embodiments, the pixel circuit 252 includes first and second transistors M1 and M2 and a storage capacitor Cst. However, the structure of the pixel circuit 252 is not limited to the exemplary embodiment shown in FIG. 4A, and can be modified in different ways.

In one exemplary embodiment of FIG. 4A, a first electrode of the first transistor (switching transistor) M1 is connected to a data line Dj, and a second electrode thereof is connected to a first node N1. In this case, the first electrode and the second electrode of the first transistor M1 may be different from each other. For example, if the first electrode is a source electrode, the second electrode may be a drain electrode. In addition, a gate electrode of the first transistor M1 is connected to a scan line Si. The first transistor M1 is turned on when a scan signal having a voltage for turning on the first transistor M1 (e.g., low level gate-on voltage) is provided from the scan line Si, thereby electrically connecting the data line Dj and the first node N1. In this case, a data signal of the corresponding frame is provided to the data line Dj, and correspondingly, the data signal is transmitted to the first node N1. The data signal transmitted to the first node N1 is charged to the storage capacitor Cst.

A first electrode of the second transistor (driving transistor) M2 is connected to the first pixel power source ELVDD, and a second electrode thereof is connected to a first electrode of the rod-shaped LED LD. In addition, a gate electrode of the second transistor M2 is connected to the first node N1. The second transistor M2 controls the amount of a driving current, which is provided to the rod-shaped LED LD, according to the voltage of the first node N1.

One electrode of the storage capacitor Cst is connected to the first pixel power source ELVDD, while the other electrode is connected to the first node N1. The storage capacitor Cst is charged with a voltage corresponding to the data signal provided to the first node N1, and hoLD the charged voltage until the data signal of the next frame is provided.

For ease of description, the pixel circuit 252 with a relatively simple structure, which includes the first transistor M1 for transmitting the data signal to inside of the pixel 250, the storage capacitor Cst for storing the data signal, and the second transistor M2 for providing the driving current corresponding to the data signal to the rod-shaped LED LD is shown in FIG. 4A. However, the inventive concepts are not limited thereto, and the structure of the pixel circuit 252 can be modified in different ways. For example, the pixel circuit 252 may also further include other circuit elements, such as at least one transistor element for compensating the threshold voltage of the second transistor M2, at least one transistor element for initializing the voltage of the first node N1 or the voltage applied to one electrode of the rod-shaped LED LD, and/or at least one transistor element for controlling the light-emitting period, or a boosting capacitor for boosting the voltage of the first node N1.

In addition, in FIG. 4A, the transistors included in the pixel circuit 252, for example, the first and second transistors M1 and M2 are all shown as the P-type transistors, but the inventive concepts are not limited thereto. That is, at least one of the transistors M1 and M2 included in the pixel circuits 252 may be changed to the N-type transistor.

Referring to FIG. 4B, in some exemplary embodiments, the first and second transistors M1 and M2 may be implemented as the N-type transistor. The pixel circuit 252 shown in FIG. 4B has the same configuration as the pixel circuit 252 in FIG. 4A, except for the positions of some connected components due to a change in the transistor type. Accordingly, a detailed description thereof will be omitted. In some exemplary embodiments, the pixel 250 shown in FIG. 4B may also include a plurality of rod-shaped LEDs LD that are connected parallel to each other.

Referring to FIG. 4C, in some exemplary embodiments, the pixel 250 may also include a plurality of rod-shaped LEDs LD that are connected in different directions. In this case, the pixel 250 may be DC-driven or AC-driven. Since it is already described above with reference to FIG. 3E, a detailed description will be omitted.

Figure 5:
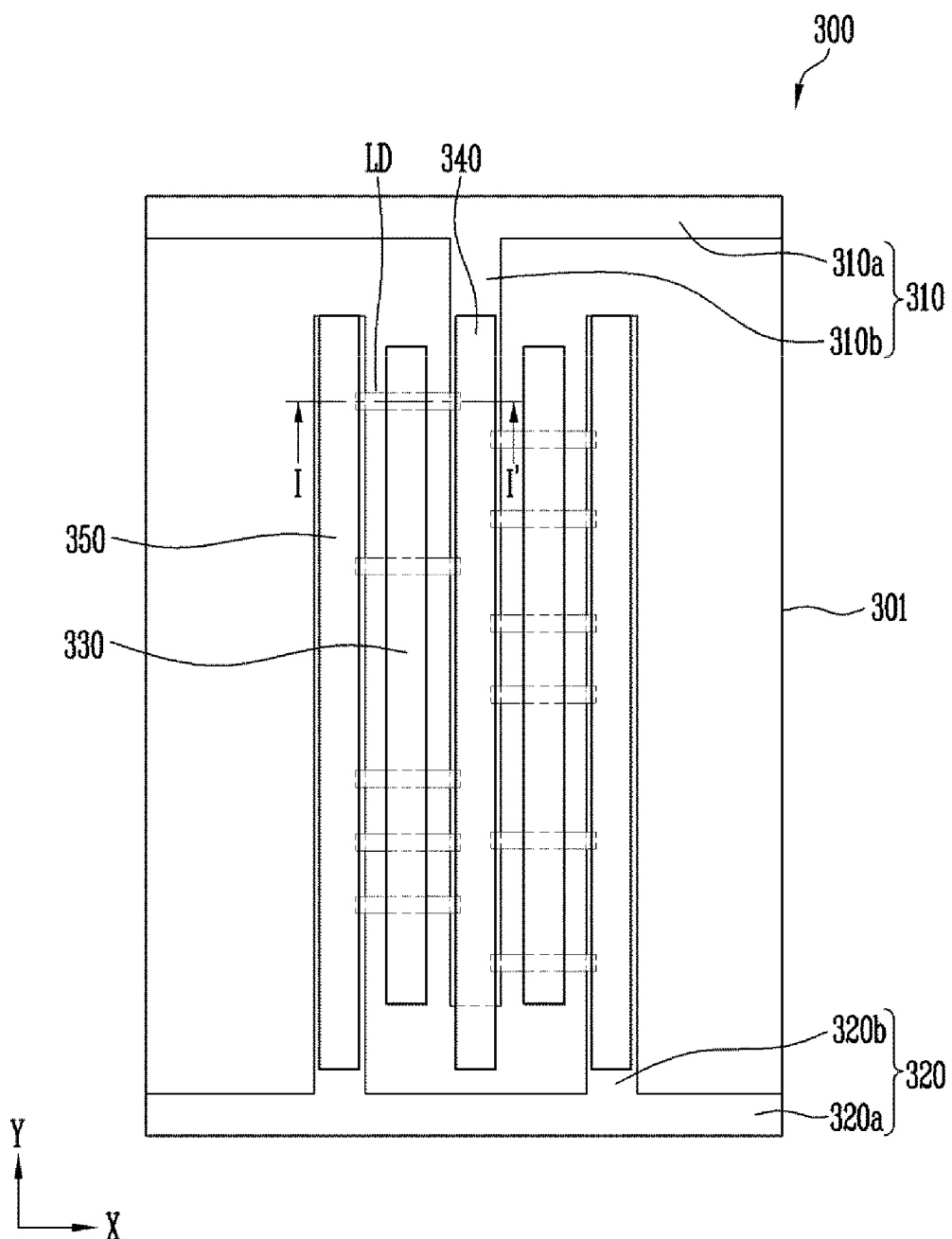
FIG. 5 is a top plan view illustrating the unit light-emitting area of the light-emitting device according to an exemplary embodiment of the inventive concepts, particularly a top plan view of a light-emitting area of each pixel.
Figure 6:
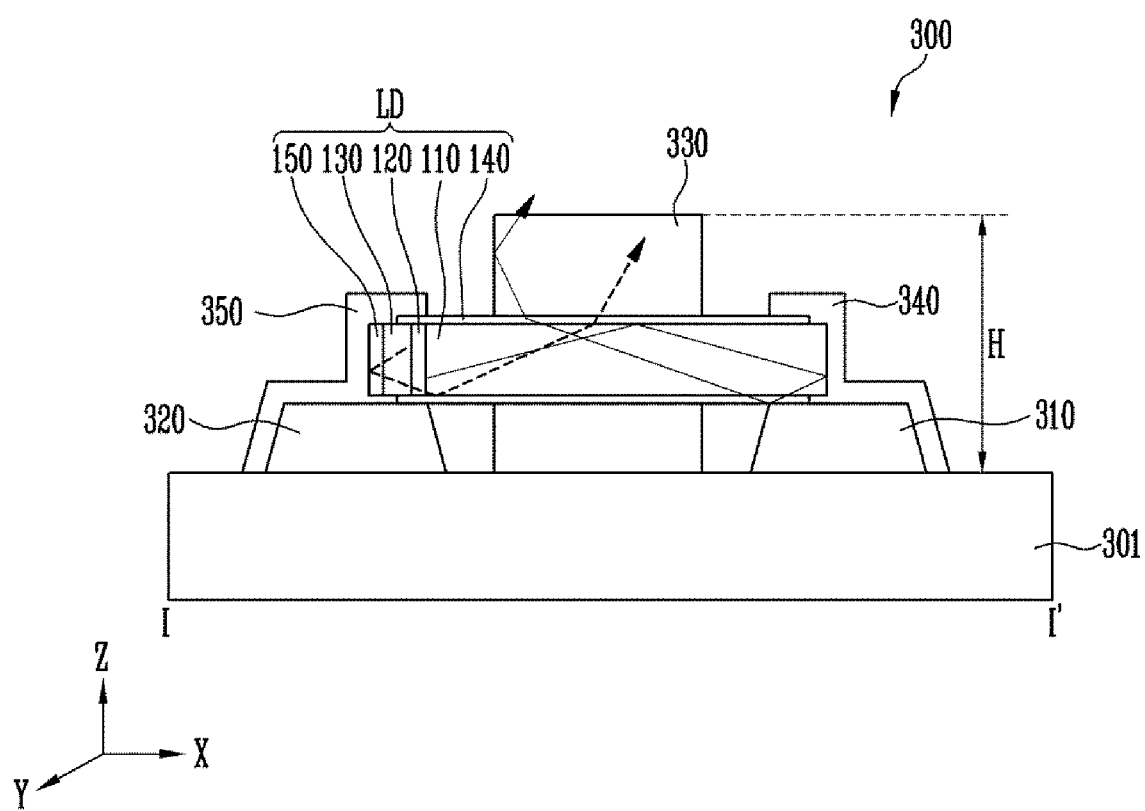
FIG. 6 illustrates a cross-sectional view of FIG. 5 taken along the line I-I'.
Figure 7:
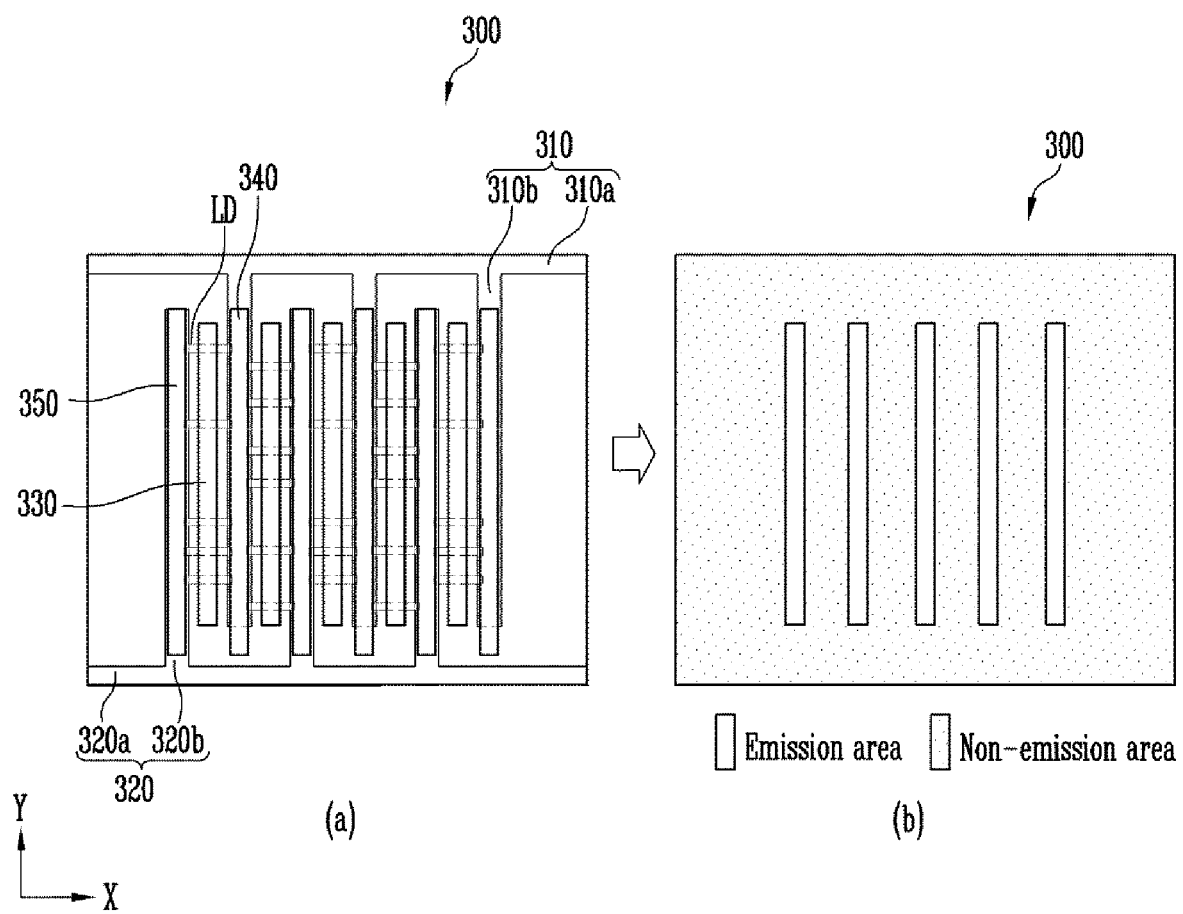
FIG. 7 is a top plan view illustrating different phases of a luminance uniformity effect by the exemplary embodiments shown in FIG. 5 and FIG. 6.

FIG. 5 is a top plan view of a unit light-emitting area of a light-emitting device according to an exemplary embodiment of the inventive concepts, particularly a top plan view of a light-emitting area of each pixel. In addition, FIG. 6 is a cross-sectional view of FIG. 5 taken along the line I-I', and FIG. 7 is a top plan view of luminance uniformity effect by the exemplary embodiment shown in FIGS. 5 and 6. For ease of description, in FIG. 5 to FIG. 7, the rod-shaped LEDs used as the light-emitting source in each unit light-emitting area, and components therearound will be shown.

Referring to FIGS. 5 and 6, the light-emitting device according to the current exemplary embodiment of the inventive concepts includes a substrate (or "base layer") 301, and a unit light-emitting area 300 disposed on the substrate 301. In some exemplary embodiments, the unit light-emitting area 300 according to the current exemplary embodiment inventive concepts may be, for example, a light-emitting area of each of the pixels 250 that forms the emission area 240 as shown in FIG. 2. That is, the light-emitting device according to the current exemplary embodiment of the inventive concepts may be a light-emitting display device that includes, on the substrate 301, a plurality of unit light-emitting areas 300 as shown in FIG. 5. For example, the light-emitting device according to the current exemplary embodiment of the inventive concepts may include a plurality of pixels (250 in FIG. 2), which are disposed on the substrate 301 and each of which respectively includes at least one unit light-emitting area 300. However, the inventive concepts are not limited thereto. That is, the inventive concepts may also be applied to other light-emitting devices other than the light-emitting display device described above.

In some exemplary embodiments, the substrate 301 may be a rigid substrate or a flexible substrate. For example, the substrate 301 may be a rigid substrate that is made of glass or tempered glass, or a flexible substrate that is made of a thin-film flexible plastic material. In addition, in some exemplary embodiments, the substrate 301 may be a substrate that is made of a transparent material, i.e., the substrate 301 may be a light-transmissive substrate, but it is not limited thereto. For example, in another exemplary embodiment, the substrate 301 may also be a non-transparent and/or reflective substrate.

In some exemplary embodiments, each unit light-emitting area 300 includes a first electrode 310 and a second electrode 320, and a plurality of rod-shaped LEDs LD disposed between the first electrode 310 and the second electrode 320, contact electrodes 340 and 350 configured to electrically connecting the rod-shaped LEDs LD to the first electrode 310 and the second electrode 320, and a light-transmitting structure 330 disposed between the first electrode 310 and the second electrode 320 to overlap at least one region of the rod-shaped LEDs LD. In some exemplary embodiments, one or more insulating layers (not shown) may be disposed between the substrate 301 and the first and second electrodes 310 and 320. For example, a buffer layer may be disposed between the substrate 301 and the first and second electrodes 310 and 320 to form a smooth surface at an upper part of the substrate 301 and to prevent impurities from penetrating there through. The insulating layer may include an oxide layer or a nitride layer such as $SiO_x$ or $SiN_x$, but it is not limited thereto. The insulating layer may be optional.

In some exemplary embodiments, the first electrode 310 and the second electrode 320 are separated from each other in each unit light-emitting area 300. For example, the first electrode 310 and the second electrode 320 may be disposed separately from and parallel to each other in at least one region of each unit light-emitting area 300. In some exemplary embodiments, the first electrode 310 and the second electrode 320 may be disposed to be paired within the unit light-emitting area 300 such that at least one region of the former faces at least one region of the latter.

For example, the first electrode 310 and the second electrode 320 may respectively include main electrode portions 310a and 320a, and at least one of sub-electrode portions 310b and 320b that are branched from the main electrode portions 310a and 320a. In addition, the sub-electrode portion 310b of the first electrode 310 and the sub-electrode portion 320b of the second electrode 320 may be disposed in parallel to be separated from each other while having a predetermined distance in between.

In this case, the main electrode portions 310a and 320a and the sub-electrode portions 310b and 320b are not specifically limited to a certain shape. For example, the main electrode portions 310a and 320a and the sub-electrode portions 310b and 320b are shown in FIG. 5 to have a rectangular bar shape, but they may have various shapes other than the bar shape, and for example, may be modified to a vortex shape. In addition, the number of the sub-electrode portions 310b and 320b branched from the each of the main electrode portions 310a and 320a are not specifically limited. For example, FIG. 5 shows that two second sub-electrode portions 320b are disposed at opposite sides to interpose one first sub-electrode portion 310b, but they can be modified in different ways. For example, as in the exemplary embodiment shown in FIG. 7, the same number of the first sub-electrode portions 310b and the second sub-electrode portions 320b may be provided, and they can be alternately disposed in the unit light-emitting area 300.

In some exemplary embodiments, the first electrode 310 and the second electrode 320 may be disposed in the same layer on one surface of the substrate 301 while being separated from each other. For example, the first electrode 310 and the second electrode 320 may be disposed at the same height and parallel to each other such that they are separated from each other on a top surface of the substrate 301, and may be alternately disposed with respect to each other. However, the inventive concepts are not limited thereto. In another exemplary embodiment, the first electrode 310 and the second electrode 320 may be disposed in different layers, or at different heights.

In some exemplary embodiments, the first electrode 310 and/or the second electrode 320 may include at least one of a metal or an alloy, a conductive polymer, and a conductive metal oxide. Examples of the metal for forming the first electrode 310 and/or the second electrode 320 include Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, and Pb, and in addition, various metals can be used. Examples of the alloy for forming the first electrode 310 and/or second electrode 320 include MoTi, and AlNiLa, and in addition, various alloys can be used. Examples of the multilayer forming the first electrode 310 and/or the second electrode 320 include Ti/Cu, Ti/Au, Mo/Al/Mo, ITO/Ag/ITO, TiN/Ti/Al/Ti, and TiN/Ti/Cu/Ti, and in addition, various conducting materials with a multilayer structure can be used. Examples of the conductive polymer for forming the first electrode 310 and/or second electrode 320 include a polythiophene-based compound, a polypyrrole-based compound, a polyaniline-based compound, a polyacetylene-based compound, a polyphenylene-based compound, and a mixture thereof, and particularly among polythiophene-based compounds, a PEDOT/PSS compound can be used. Examples of the conductive metal oxide forming the first electrode 310 and/or the second electrode 320 include ITO, IZO, AZO, ITZO, ZnO, and SnO2. Further, in addition to the aforementioned conductive materials, any material can be used to form the first electrode 310 and/or the second electrode 320 as long as it is a conductive material. The first electrode 310 and/or the second electrode 320 are not specifically limited to have a specific electrode structure, and they can be formed in various different ways to have a single-layer or multilayer structure.

The first electrode 310 and the second electrode 320 may be electrically connected to a predetermined signal or power line, or a circuit element, respectively. For example, the first electrode 310 and the second electrode 320 may be respectively connected to the scan line Si, the data line Dj, the first or second pixel power supply (ELVDD, ELVSS) and/or the pixel circuit 252 that are described above with reference to the exemplary embodiments of FIG. 3A to FIG. 4C.

A plurality of rod-shaped LEDs LD are disposed between the first electrode 310 and the second electrode 320. On the other hand, the exemplary embodiment shown in FIG. 5, for example, corresponds to the pixel 250 having the structure shown in FIG. 3B, and when the structure of the pixel 250 is changed, the connection structure between the first electrode 310 and/or the second electrode 320 and the rod-shaped LEDs LD can also be changed. For example, the pixel circuit 252 as shown in FIGS. 4A to 4C may further be disposed inside each unit light-emitting area 300.

In some exemplary embodiments, the pixel circuit 252, along with the first and the second electrode 310 and 320, is disposed on the same surface of the substrate 301, such that it can be disposed in the same layer as the first and the second electrode 310 and 320, or can be disposed in different layers therefrom. For example, the pixel circuit 252 are disposed at an intermediary layer (not shown) that is interposed between the substrate 301 and a predetermined layer in which the first and second electrodes 310 and 320 are disposed, and may be electrically connected to the first electrode 310 and/or the second electrode 320 through a contact hole or a via hole. In this case, the first electrode 310 and/or the second electrode 320 may not be connected to the scan line Si or the data line Dj, but may be connected to the pixel circuit 252 shown in FIGS. 4A to 4C, or may alternatively be electrically connected to a first or second pixel power source (ELVDD, ELVSS).

In some exemplary embodiments, at least some of the rod-shaped LEDs LD disposed in each unit light-emitting area 300 may be respectively disposed between the first electrode 310 and the second electrode 320 such that they are electrically coupled to the first electrode 310 and the second electrode 320. For example, the plurality of rod-shaped LEDs LD disposed within each unit light-emitting area 300 are electrically connected between the electrode 310 and the second electrode 320, with one end being physically and/or electrically connected to the first electrode 310 and the other end being physically and/or electrically connected to the second electrode 320. In this case, the rod-shaped LEDs LD may have a length (L in FIG. 1), which is greater than the shortest distance between the first electrode 310 and the second electrode 320 that are adjacent to each other.

In some exemplary embodiments, the plurality of rod-shaped LEDs LD may be disposed in each unit light-emitting area 300, but the number of the rod-shaped LEDs is not specifically limited. For example, the plurality of rod-shaped LEDs LD may be disposed between the first sub-electrode portion 310b and the second sub-electrode portion 320b that face each other as a pair.

In some exemplary embodiments, opposite ends of at least some of the rod-shaped LEDs LD may be respectively disposed on the first sub-electrode portion 310b and the second sub-electrode portion 320b, but all the rod-shaped LEDs LD disposed in the unit light-emitting area 300 are not limited to the positions described above. For example, the number of the rod-shaped LEDs LD connected between the first electrode 310 and the second electrode 320 or how they are dispersed is not specifically limited. In addition, although not shown, at least one rod-shaped LED LD, which is not connected in between the first and second electrodes 310 and 320 as a whole but is randomly disposed, may be further provided in each unit light-emitting area 300. That is, at least one rod-shaped LED LD, which is not aligned between the first and second electrodes 310 and 320 but is randomly disposed, may also be further present in the unit light-emitting area 300 and/or the area surrounding it.

For ease of description, each of the rod-shaped LEDs LD connected between the first electrode 310 and the second electrode 320 is shown in FIG. 5 such that it is uniformly aligned in a specific direction (e.g., the horizontal direction) perpendicular to the direction in which the first and second sub-electrode portions 310b and 320b extend (e.g., the vertical direction)), but the arrangement of the rod-shaped LEDs LD is not limited thereto. For example, at least some of the rod-shaped LEDs LD may be disposed between the first electrode 310 and the second electrode 320 in an oblique direction. That is, the direction in which the rod-shaped LEDs LD are connected and/or arranged is not specifically limited.

As previously described with reference to FIG. 1, each of the rod-shaped LEDs LD includes at least a first conductive semiconductor layer 110, an active layer 120, and a second conductive semiconductor layer 130. In addition, in some exemplary embodiments, each of the rod-shaped LEDs LD may further include an insulating film 140 that covers at least the active layer 120, and/or at least one electrode layer that is disposed at one end of the first or second conductive semiconductor layers 110 and 130. For example, each of the rod-shaped LEDs include an insulating film 140 that completely covers a side surface of the active layer 120 and covers at least some of side surfaces of the first and second conductive semiconductor layers 110 and 130, and an electrode layer 150 that is disposed at one end of the rod-shaped LEDs LD, e.g. one end thereof in which the second conductive semiconductor layer 130 is disposed.

In some exemplary embodiments, contact electrodes 340 and 350 are disposed at opposite ends of the rod-shaped LEDs LD. Correspondingly, even if the side surface of the rod-shaped LEDs LD is covered by the insulating film 140, the opposite ends of the rod-shaped LEDs LD not covered by the insulating film 140 may be electrically connected to the first electrode 310 and the second electrode 320 via the contact electrodes 340 and 350, respectively. In addition, when the contact electrodes 340 and 350 are disposed, the rod-shaped LEDs LD may be prevented from being displaced from their aligned positions.

The contact electrodes 340 and 350 allow the rod-shaped LEDs LD to be electrically connected between the first electrode 310 and the second electrode 320. For example, the contact electrodes 340 and 350 may be disposed at opposite ends of the rod-shaped LEDs LD such that the opposite ends of the rod-shaped LEDs LD are respectively electrically connected to the first electrode 310 and the second electrode 320.

In some exemplary embodiments, the contact electrodes 340 and 350 may include a first contact electrode 340 for connecting all of one ends of the plurality of rod-shaped LEDs LD to the first electrode 310, the first contact electrode 340 is disposed between the same pair of the first and second sub-electrode portions 310b and 320b. The contract electrodes may also include a second contact electrode 350 for connecting all of the other ends of the plurality of rod-shaped LEDs LD to the second electrode 320. For example, when each of the rod-shaped LEDs LD includes the insulating film 140, which exposes at least the opposite ends and encloses the side surface, and the exposed opposite ends are respectively disposed on the first electrode 310 and the second electrode 320, the contact electrodes 340 and 350 may include: the first contact electrode 340 that directly contacts the exposed ends of the rod-shaped LEDs LD and the first electrode 310, and covers one ends of the rod-shaped LEDs LD and the first electrode 310; and the second contact electrode 350 that directly contacts the exposed other end of the rod-shaped LEDs LD and the second electrode 320 and covers the other end of the rod-shaped LEDs LD and the second electrode 320. In some exemplary embodiments, the widths of the first and second electrodes 310 and 320 and the first and second contact electrodes 340 and 350 and/or the region in which they overlaps each other may be modified in various different ways. For example, the exemplary embodiment of FIG. 5 shows that each of the first and second electrodes 310 and 320 has a wider width than the first and second contact electrodes 340 and 350, and opposite (e.g., left/right) sides thereof are exposed outside of the first and second contact electrodes 340 and 350, but the structure in which the first and second electrodes 310 and 320 and the first and second contact electrodes 340 and 350 are arranged may be modified. For example, as shown in FIG. 6, the first and second contact electrodes 340 and 350 may cover the first and second electrodes 310 and 320 at one side.

On the other hand, the exemplary embodiment shown in FIG. 5 shows that each of the first contact electrode 340 and the second contact electrode 350 extends in the direction toward which the first and second sub-electrode portions 310b and 320b extend, such that the plurality of rod-shaped LEDs LD disposed between the first and second electrodes 310 and 320 are all connected to the first and second electrode 310 and 320. That is, according to the exemplary embodiment of FIG. 5, the plurality of rod-shaped LEDs LD may share one first contact electrode 340 and one second contact electrode 350, respectively. However, the inventive concepts are not limited thereto. For example, in another exemplary embodiment, the first contact electrode 340 and the second contact electrode 350 may be disposed to be individually separated at opposite ends of each of the rod-shaped LEDs LD.

In the exemplary embodiment of the inventive concepts, the contact electrodes 340 and 350 may be implemented as a reflective electrode. For this purpose, the contact electrodes 340 and 350 may include at least one reflective metal layer. For example, the contact electrodes 340 and 350 may be implemented as a reflective electrode that includes a metal layer including at least one of Ag and Cu, or as a multilayer including at least one of Ti/Al/Ti, ITO/Ag/ITO, and Mo/Al/Mo. However, the structure of the conductive material for forming the contact electrodes 340 and 350 and/or the conductive layer is not limited to the exemplary embodiment described above. For example, the contact electrodes 340 and 350 may be formed by using various conductive materials for forming the electrode, and particularly, may be implemented to have a reflective property.

In some exemplary embodiments, the metal for forming the contact electrodes 340 and 350 may include Ti, Cu, Mo, Al, Au, Cr, TiN, Ag, Pt, Pd, N1, Sn, Co, Rh, Ir, Fe, Ru, Os, Mn, W, Nb, Ta, Bi, Sb, and Pb, and in addition, various metals may be used. Examples of the alloy for forming the contact electrodes 340 and 350 may include MoTi, and AlNiLa, and in addition, various alloys may be used. Examples of the multilayer for forming the contact electrodes 340 and 350 may include Ti/Al/Ti, Ti/Cu, Ti/Au, Mo/Al/Mo, ITO/Ag/ITO, TiN/Ti/Al/Ti, and TiN/Ti/Cu/Ti, and in addition various multilayers may be used.

The contact electrodes 340 and 350 are formed in the active layer 120 of the rod-shaped LEDs LD such that light emitted via the opposite ends of the rod-shaped LEDs LD is reflected to change the traveling path of the light. The light reflected from the contact electrodes 340 and 350 may be emitted toward the front of the substrate 301 (e.g., the top or front surface) via the rod-shaped LEDs LD and/or the light-transmitting structure 330. In this example, the light being emitted toward the front of the substrate 301 means that light is emitted, as shown in FIG. 6, from an upper part of the substrate 301, i.e., including a direction crossing the plane in which the substrate 301 is placed (e.g., a direction including a direction perpendicular to the plane in which the substrate 301 is placed, and a direction that is obliquely tilted with a predetermined angle for the plane). For example, when the substrate 301 is disposed on the X-Y plane, the light reflected from the contact electrodes 340 and 350 may be emitted from the upper part of the substrate 301 in the direction crossing the X-Y plane, for example, in the Z direction or oblique direction to the Z direction.

The light-transmitting structure 330 may be transparent or semi-transparent to transmit the light from the rod-shaped LEDs LD to outside, for example, to the direction of a light emitting surface of the light-emitting device. The light-transmitting structure 330 may be disposed between the first electrode 310 and the second electrode 320 to overlap at least one region of the rod-shaped LEDs LD. For example, the light-transmitting structure 330 may be disposed to overlap at least a center part of the rod-shaped LEDs LD, except for at the opposite ends of the rod-shaped LEDs LD in which the reflective contact electrodes 340 and 350 are provided, thereby fixing the rod-shaped LEDs LD to their aligned positions.

In some exemplary embodiments, the light-transmitting structure 330 may extend to cross the plurality of rod-shaped LEDs LD. For example, at least one light-transmitting structure 330 is disposed in each unit light-emitting area 300, and each light-transmitting structure 330 may extend between the first electrode 310 and the second electrode 320 in the direction parallel to the first electrode 310 and the second electrode 320, so as to overlap the plurality of rod-shaped LEDs LD. For example, the light-transmitting structure 330 may extend between the paired first and second sub-electrode portions 310b and 320b in the direction parallel to the first and second sub-electrode portions 310b and 320b, thereby crossing and overlapping the plurality of rod-shaped LEDs LD disposed between the first and second sub-electrode portions 310b and 320b. For example, the light-transmitting structure 330 may be disposed perpendicular to the length (L of FIG. 1) direction of the rod-shaped LEDs LD.

For example, the light-transmitting structure 330 may have a rectangular bar shape, which extends between the paired first and second sub-electrode portions 310b and 320b in the direction parallel to the first and second sub-electrode portions 310b and 320b to overlap the plurality of rod-shaped LEDs LD disposed between the first and second sub-electrode portions 310b and 320b. However, in the current exemplary embodiment of the inventive concepts, the shape of the light-transmitting structure 330 is not limited thereto, and the shape of the light-transmitting structure 330 may be modified in various different ways.

Referring to FIG. 6, the light-transmitting structure 330 has a predetermined height H along the direction crossing the plane in which the substrate 301 is placed (e.g., X-Y plane) to facilitate light emission, and the height H of the light-transmitting structure 330 may be greater than those of the rod-shaped LEDs LD. For example, the light-transmitting structure 330 may be disposed to protrude across the rod-shaped LEDs LD in the Z direction perpendicular to the plane in which the substrate 301 is placed. In addition, a bottom surface of the light-transmitting structure 330 may contact the substrate 301. Light emitted from the rod-shaped LEDs LD is emitted by the light-transmitting structure 330 toward the front of the substrate 301, e.g., toward the upper part of the substrate 301 as shown in FIG. 6. Particularly, after the light is emitted from the rod-shaped LEDs LD, the light-transmitting structure 330 is provided to emit the light, which is reflected from the contact electrodes 340 and 350 and re-enters into the rod-shaped LEDs LD, toward the front of the substrate 301. For example, the light-transmitting structure 330 has a higher refractive index than the air, and may have a lower refractive index than the rod-shaped LEDs LD. In some exemplary embodiments, a reflective layer (not shown) may be further provided at one surface of the substrate 301. For example, one or more reflective layers may be further provided at the bottom surface of the substrate 301 or between the substrate 301 and the light-transmitting structure 330.

The light-transmitting structure 330 may be implemented as a substantially transparent light-transmissive structure through which light can be transmitted (i.e., having high light transmittance). For example, the light-transmitting structure 330 may consist of at least one transparent inorganic insulator and/or organic insulator. Examples of the inorganic insulator for forming the light-transmitting structure 330 may include a silicon oxide (SiOx), a silicon nitride (SiNx), and the like, and in addition, the light-transmitting structure 330 may consist of various light-transmissive inorganic insulators. Examples of the organic insulator for forming the light-transmitting structure 330 may include a silicone resin and the like, and in addition, the light-transmitting structure 330 may consist of various light-transmissive organic insulators. In some exemplary embodiments, when the light-transmitting structure 330 is made of a silicone resin, the light-transmitting structure 330 may include a plurality of scatterers that are distributed within the silicone resin. For example, the light-transmitting structure 330 may be made of a silicone resin composition that includes scatterers including at least one of $TiO_2$ and $SiO_2$.

In the current exemplary embodiment of the inventive concepts as described above, the reflective contact electrodes 340 and 350 are disposed at the opposite ends of the rod-shaped LEDs LD, and in addition, the light-transmitting structure 330 is disposed to extend between the first electrode 310 and the second electrode 320 to cross the plurality of rod-shaped LEDs LD. According to an exemplary embodiment, the light, which is reflected by the contact electrodes 340 and 350 from the opposite ends of the rod-shaped LEDs LD and re-enters into the rod-shaped LEDs LD, can be emitted (or transmitted) toward the front of the substrate 301 by the light-transmitting structure 330. Therefore, even if the rod-shaped LEDs LD are non-uniformly distributed in each unit light-emitting area 300, uniformity of light emission of the unit light-emitting area 300 may be improved.

For example, the unit light-emitting area 300 formed as shown in FIG. 7 at (a) may, as shown in FIG. 7 at (b), emit light from the region where the light-transmitting structure 330 is provided. Accordingly, when the light-transmitting structures 330 are uniformly disposed in each unit light-emitting area 300, regardless of how the rod-shaped LEDs LD are uniformly arranged (or scattered), a uniform light-emitting characteristic is achieved.

On the contrary, in the light-emitting device of a comparative example in which the reflective contact electrodes 340 and 350 and/or the transmissive light-transmitting structure 330 is not included, a separate reflective structure may be required to change the path of light emitted from the opposite ends of the rod-shaped LEDs LD, and light-emission of the rod-shaped LEDs LD scattered in each unit light-emitting area 300 may be visually recognized in the form of point light emission. In addition, in the light-emitting device of the comparative example, the emission point may be randomly scattered in accordance with the positions of the respective rod-shaped LEDs LD. Accordingly, the light-emitting device of the comparative example may show a non-uniform light emission characteristic when compared with that of the light-emitting device according to the current exemplary embodiment of the inventive concepts.

FIGS. 8A to 8E are sequential cross-sectional views of a manufacturing method of a light-emitting device according to an exemplary embodiment of the inventive concepts. The manufacturing method of the light-emitting device according to the exemplary embodiments of FIG. 8A to FIG. 8E may be applied to manufacture the light-emitting device according to the exemplary embodiment of FIG. 5 to FIG. 7, but it is not limited thereto. On the other hand, FIG. 8A to FIG. 8E show only a part of the unit light-emitting area, for example, only one rod-shaped LED disposed in the unit light-emitting area. However, as described in the exemplary embodiment of FIGS. 5 to 7, the plurality of rod-shaped LEDs may be disposed in each unit light-emitting area. Accordingly, the manufacturing method of the light-emitting device according to the exemplary embodiments of FIG. 8A to FIG. 8E will be described below, assuming that the plurality of rod-shaped LEDs are disposed in each unit light-emitting area.

Figure 8A:
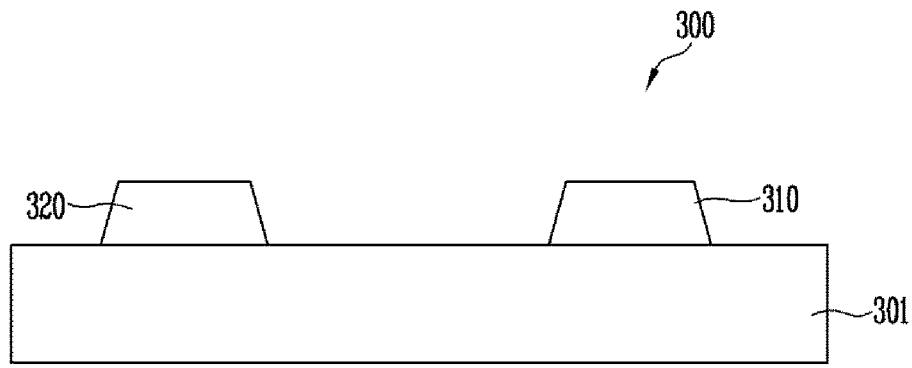
FIG. 8A, FIG. 8B, FIG. 8C, FIG. 8D, and FIG. 8E are sequential cross-sectional views illustrating a manufacturing method of a light-emitting device according to an exemplary embodiment of the inventive concepts.

Referring to FIG. 8A, a first electrode 310 and a second electrode 320 are disposed (or formed) on a substrate 301 to be separated from each other. Specifically, the substrate 301 is prepared first, and each unit light-emitting area 300 may be then defined on the substrate 301. In addition, the first electrode 310 and the second electrode 320, which are separated from each other, may be disposed (or formed) in each unit light-emitting area 300. In some exemplary embodiments, a conductive layer is formed on the entire substrate 301 and the conductive layer is then patterned, thereby forming both the first electrode 310 and the second electrode 320. Alternatively, in another exemplary embodiment, different conductive materials may be used to sequentially form the first electrode 310 and the second electrode 320.

Figure 8B:
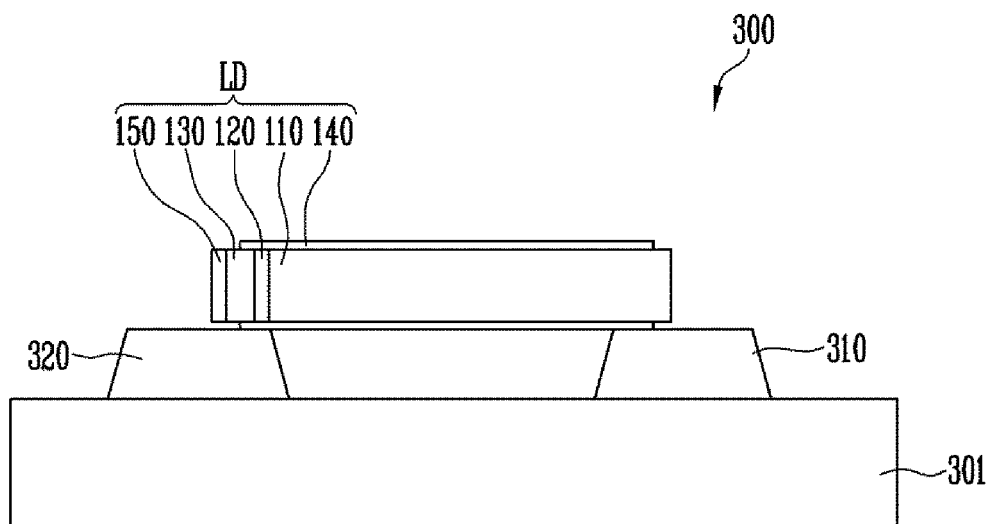

Referring to FIG. 8B, a plurality of rod-shaped LEDs LD as shown in FIG. 5 to FIG. 7 are disposed on the substrate 301 on which the first electrode 310 and the second electrode 320 are provided, and the rod-shaped LEDs LD are aligned between the first electrode 310 and the second electrode 320. Specifically, the plurality of rod-shaped LEDs LD may be put in each unit light-emitting area 300 in which the first electrode 310 and the second electrode 320 are provided. For example, an LED solution containing a plurality of rod-shaped LEDs LD may be applied or dropped in each unit light-emitting area 300 by using the inkjet printing method. In some exemplary embodiment, the LED solution may be an ink or may be in a paste state. As a solvent, a solvent-containing photoresist or an organic layer may be used, but it is not limited thereto. Further, in some exemplary embodiments, the solvent may be a volatile solvent.

After the LED solution is applied onto each unit light-emitting area 300, or when the LED solution is being applied, a voltage is applied between the first electrode 310 and the second electrode 320, thereby generating an electric field. Then, the rod-shaped LEDs LD randomly scattered in the unit light-emitting area 300 are aligned between the first electrode 310 and the second electrode 320. For example, if a DC or AC voltage is applied between the first electrode 310 and the second electrode 320, the electric field generated between the first electrode 310 and the second electrode 320 causes bipolarity of the rod-shaped LEDs LD, such that the rod-shaped LEDs LD are self-aligned between the first electrode 310 and the second electrode 320. After the alignment of the od-shaped LEDs LD is completed, the solvent of the LED solution is removed. For example, after the alignment of the rod-shaped LEDs LD is completed, the solvent of the LED solution may be volatilized and then removed.

Figure 8C:
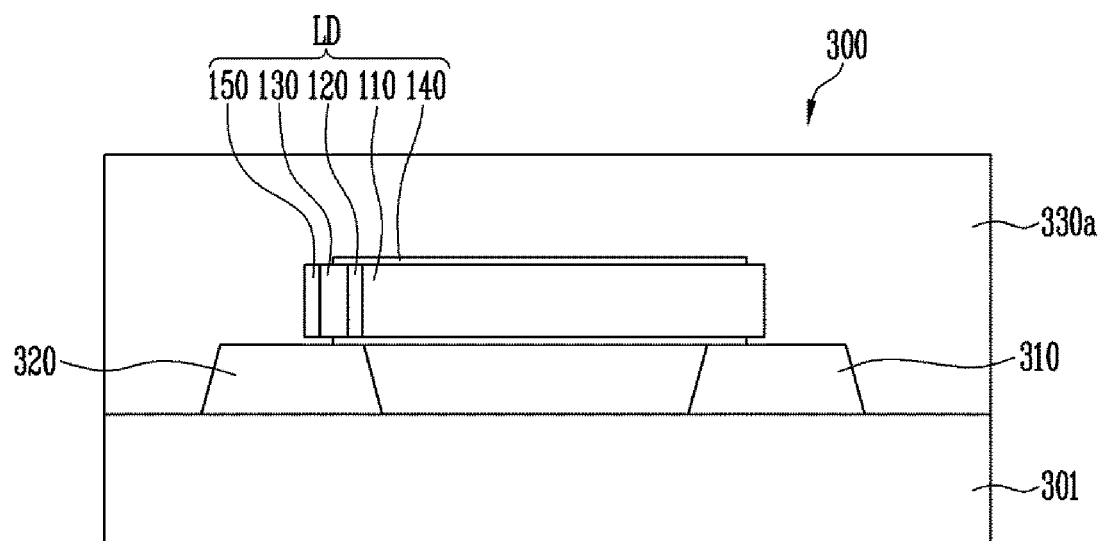

Referring to FIG. 8C, a light-transmissive insulating layer 330a is disposed (or formed) on one surface of the substrate 301 on which the rod-shaped LEDs LD are aligned. In some exemplary embodiments, the rod-shaped LEDs LD is covered by the insulating layer 330a, the insulating layer 330a may be disposed (or formed) to have a height above the height of the rod-shaped LEDs LD that are arranged. In some exemplary embodiments, the insulating layer 330a is provided to form the light-transmitting structure 330, and may consist of one or more light-transmissive insulators. For example, the insulating layer 330a may be an inorganic insulating layer that includes at least one of SiOx and SiNx, but it is not limited thereto.

Figure 8D:
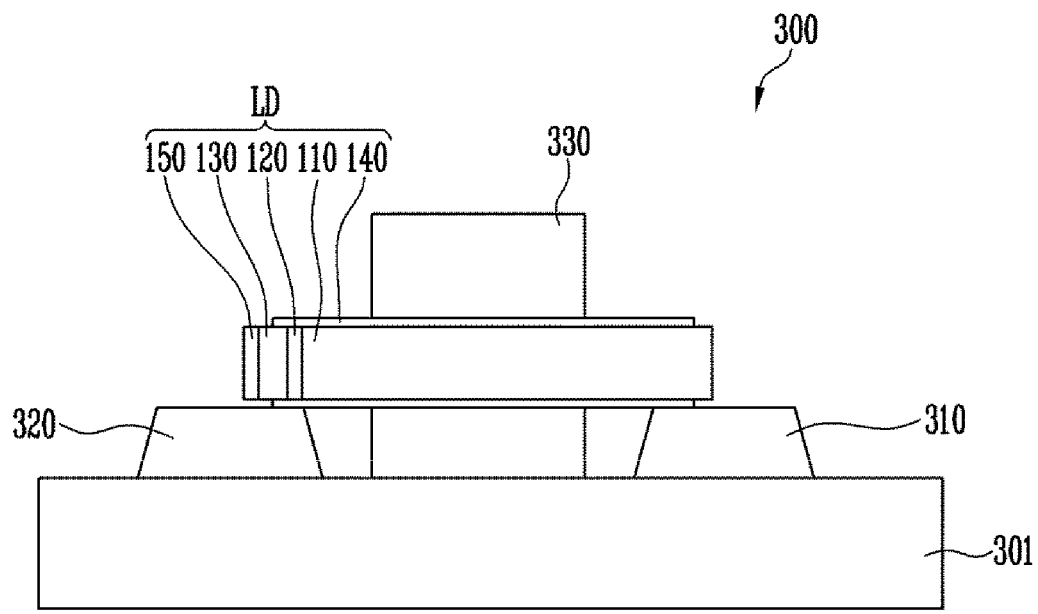

Referring to FIG. 8D, the insulating layer 330a is patterned to provide (or form) the light-transmitting structure 330 between the first electrode 310 and the second electrode 320. For example, the insulating layer 330a is patterned by using a photo process using a mask, the light-transmitting structure 330 may be, as shown in FIG. 5, disposed (or formed) to expose opposite ends of the rod-shaped LEDs LD and to cross the plurality of rod-shaped LEDs LD. For example, the light-transmitting structure 330 may be patterned to extend between the first electrode 310 and the second electrode 320, in the direction in which to overlap at least one region of the plurality of rod-shaped LEDs LD, particularly to overlap a center part of the rod-shaped LEDs LD and in the direction that crosses the rod-shaped LEDs LD. In some exemplary embodiments, the light-transmitting structure 330 may be formed to have a height above the height of the rod-shaped LEDs LD that are arranged. In addition, in some exemplary embodiments, the light-transmitting structure 330 may allow the rod-shaped LEDs LD to be fixed to their aligned positions.

Figure 8E:
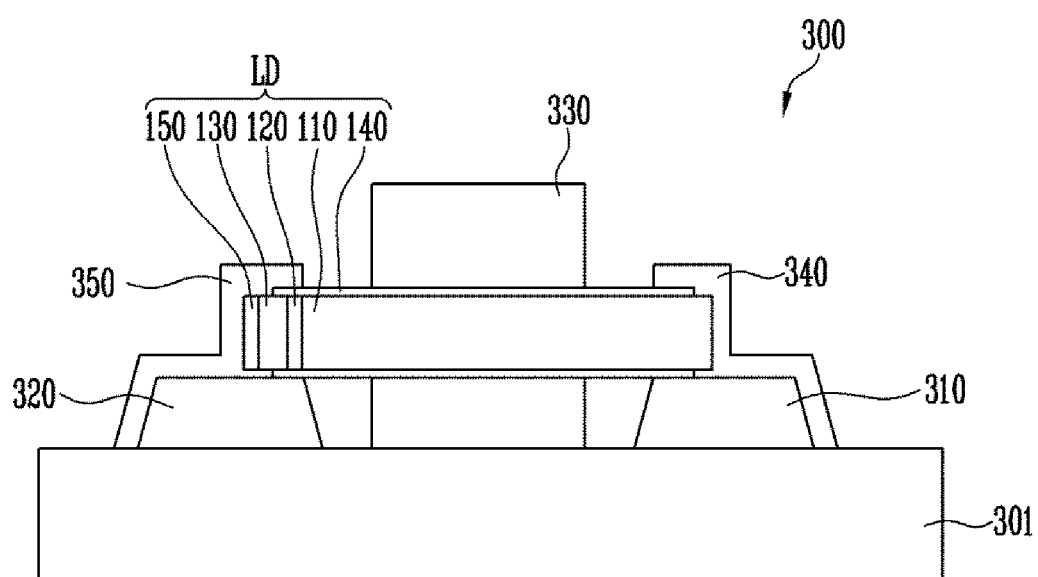

Referring to FIG. 8E, reflective contact electrodes 340 and 350 are disposed (or formed) at the opposite ends of the rod-shaped LEDs LD. In some exemplary embodiments, the reflective contact electrodes 340 and 350 may be disposed (or formed) to respectively electrically connect the opposite ends of the rod-shaped LEDs LD to the first electrode 310 and the second electrode 320. For example, the reflective contact electrodes 340 and 350 may include a first contact electrode 340 that is disposed on one end of the rod-shaped LEDs LD and electrically connects one end of the rod-shaped LEDs LD to the first electrode 310, and a second contact electrode 350 that is disposed on the other end of the rod-shaped LEDs LD and electrically connects the other end of the rod-shaped LEDs LD to the second electrode 320.

Figure 9:
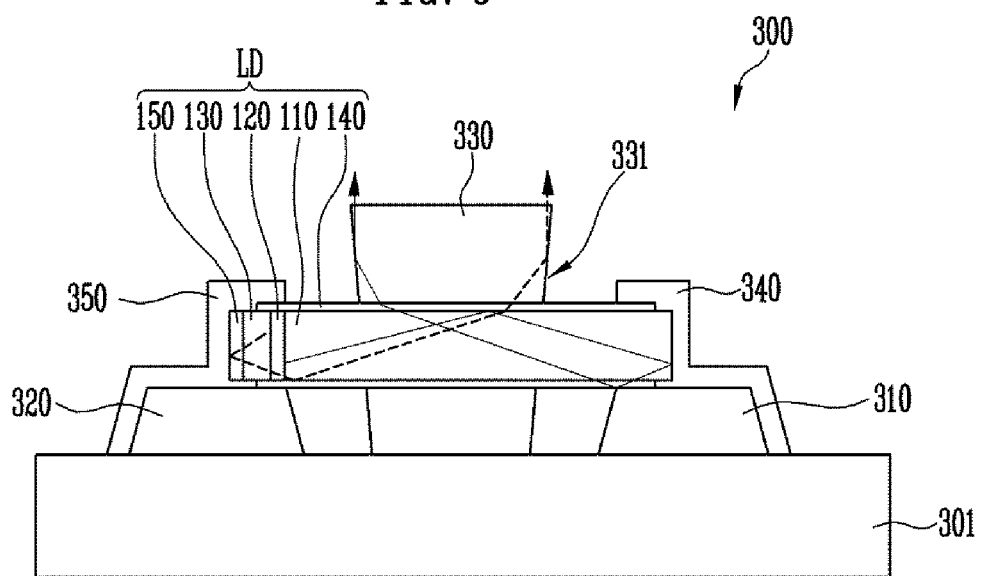
FIG. 9 is a cross-sectional view illustrating a unit light-emitting area of a light-emitting device according to an exemplary embodiment of the inventive concepts.

FIG. 9 is a cross-sectional view of a unit light-emitting area of a light-emitting device according to an exemplary embodiment of the inventive concepts. FIG. 9 shows a modified example of the exemplary embodiment shown in FIG. 6. In FIG. 9, like or similar reference numerals correspond to like elements in FIG. 6, and a detailed description thereof will be omitted.

Referring to FIG. 9, in the light-emitting device according to the current exemplary embodiment of the inventive concepts, a light-transmitting structure 330 may have an inclined side surface 331, the width of which gradually decreases toward the substrate 301. For example, a vertical cross-section of the light-transmitting structure 330 may have a reverse trapezoidal shape. In order to form the light-transmitting structure 330, for example, in the providing of the light-transmitting structure 330 shown in FIG. 8C to FIG. 8D, an insulating layer 330a may be patterned between a first electrode 310 and a second electrode 320, such that the insulating layer 330a has an inclined side surface that has a reverse taper shape.

According to the light-emitting device in the foregoing exemplary embodiments of the inventive concepts, a uniform light-emitting characteristic according to the exemplary embodiments shown in FIGS. 5 to 7 can be achieved, and can also increase the amount of light transmitted or emitted toward the front of the substrate 301. That is, in the current exemplary embodiment of the inventive concepts, the light-transmitting structure 330 may have various shapes or structures such that more light is generated from each unit light-emitting area 300.

Figure 10:
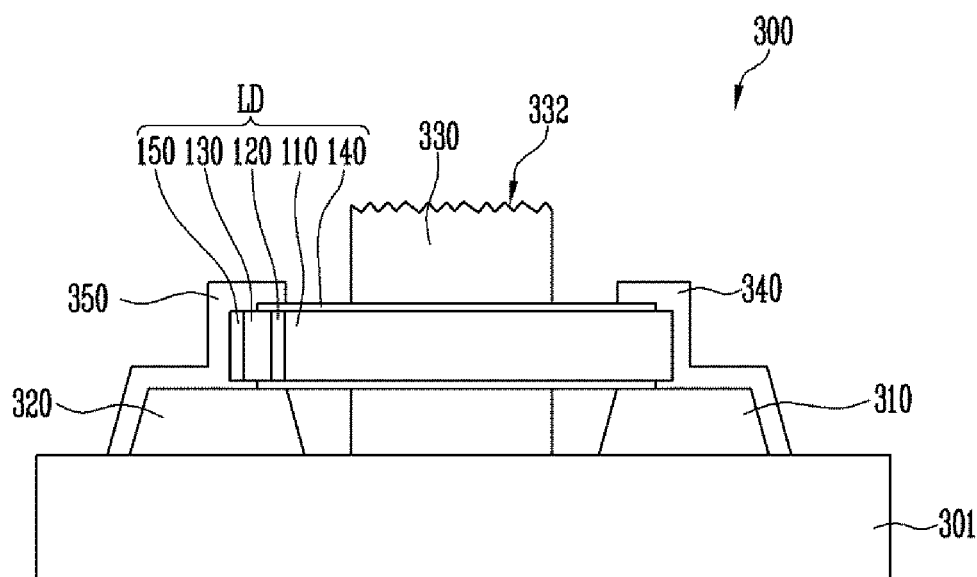
FIG. 10 is a cross-sectional view illustrating a unit light-emitting area of a light-emitting device according to an exemplary embodiment of the inventive concepts.

FIG. 10 is a cross-sectional view of a unit light-emitting area of a light-emitting device according to an exemplary embodiment of the inventive concepts. FIG. 10 shows a modified example of the embodiment shown in FIG. 6. In FIG. 10, like or similar reference numerals correspond to like elements in FIG. 6, and a detailed description thereof will be omitted.

Referring to FIG. 10, in the light-emitting device according to the current exemplary embodiment of the inventive concepts, a light-transmitting structure 330 has a top surface 332 that protrudes above rod-shaped LEDs LD, and the top surface 332 may be a rough surface in the form of protrusions and depressions. In order to provide (or form) the light-transmitting structure 330, for example, like the light-transmitting structure 330 shown in FIG. 8C to FIG. 8D, the step of providing (or forming) uneven patterns on the top surface of the insulating layer 330a or the light-transmitting structure 330 may be further included.

According to the light-emitting device in the current exemplary embodiment of the inventive concepts described above, a uniform light-emitting characteristic according to the foregoing exemplary embodiments shown in FIG. 5 to FIG. 7 may be provided, and may also increase roughness of one surface through which light of the light-transmitting structure 330 can be transmitted or emitted, for example, the top surface, thereby increasing the amount of light emitted from each unit light-emitting area 300 toward the front of the substrate 301. That is, in the current exemplary embodiment of the inventive concepts, the light-transmitting structure 330 may have various shapes or structures to improve light-emitting efficiency of the light generated from each unit light-emitting area 300.

Figure 11:
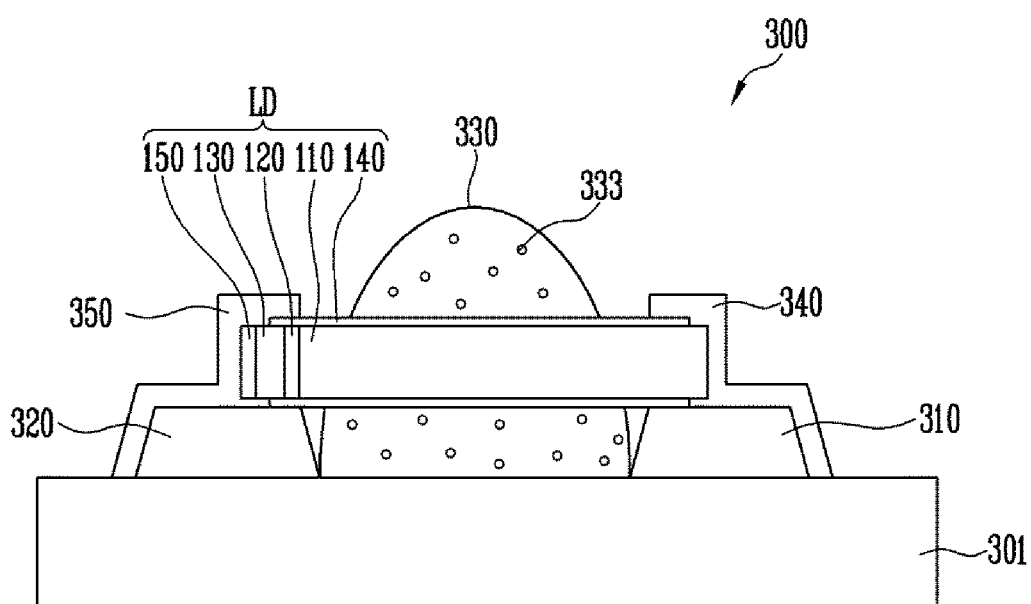
FIG. 11 is a cross-sectional view illustrating a unit light-emitting area of a light-emitting device according to an exemplary embodiment of the inventive concepts.

FIG. 11 is a cross-sectional view of a unit light-emitting area of a light-emitting device according to an exemplary embodiment of the inventive concepts. FIG. 11 shows a modified example of the embodiment shown in FIG. 6. In FIG. 11, like or similar reference numerals correspond to like elements in FIG. 6, and a detailed description thereof will be omitted.

Referring to FIG. 11, in the light-emitting device according to the current exemplary embodiment of the inventive concepts, a light-transmitting structure 330 may have a width that gradually decreases from a lower part adjacent to a substrate 301 to an upper part away from the substrate 301, along a first direction (e.g., Z direction) crossing the plane in which the substrate 301 is placed (e.g., X-Y plane). In addition, in some exemplary embodiments, the light-transmitting structure 330 may have a curved surface. For example, the light-transmitting structure 330 may have a smoothly curved slope. Additionally, as in the exemplary embodiments described above, the light-transmitting structure 330 may extend, for example, in the direction perpendicular to the length (L) direction of the rod-shaped LEDs LD to cross a plurality of rod-shaped LEDs LD disposed in the same column.

In some exemplary embodiments, the light-transmitting structure 330 shown in FIG. 11 may consist of at least one layer of an organic insulator. For example, the light-transmitting structure 330 may be made of a silicone resin. In addition, in some exemplary embodiments, a plurality of scatterers 333 may be distributed within the light-transmitting structure 330 that is made of a silicone resin. For example, the light-transmitting structure 330 may be made of a silicone resin composition that includes scatterers including at least one of $TiO_2$ and $SiO_2$.

According to the light-emitting device in the current exemplary embodiment of the inventive concepts described above, a uniform light-emitting characteristic can be provided and the amount of light emitted from each unit light-emitting area 300 can be increased using the scatterers 333. That is, in the current exemplary embodiment of the inventive concepts, the light-transmitting structure 330 may include a variety of materials, thereby improving light-emitting efficiency of the light generated from each unit light-emitting area 300.

FIG. 12A to FIG. 12D are sequential cross-sectional views of a manufacturing method of a light-emitting device according to yet another exemplary embodiment of the inventive concepts. The manufacturing method of the light-emitting device according to the embodiments FIG. 12A to FIG. 12D may be, for example, applied to manufacture the light-emitting device according to the exemplary embodiment of FIG. 11, but it is not limited thereto. Only one rod-shaped LED disposed in a unit light-emitting area is shown in FIG. 12A to FIG. 12D, but a plurality of rod-shaped LEDs may be disposed in each unit light-emitting area, as in the exemplary embodiments described above. Accordingly, the manufacturing method of the light-emitting device according to the exemplary embodiments of FIG. 12A to FIG. 12D will be described below, assuming that a plurality of rod-shaped LEDs are disposed in each unit light-emitting area. In addition, in FIG. 12A to FIG. 12D, like or similar reference numerals correspond to like elements in FIG. 8A to FIG. 8E, and a detailed description thereof will be omitted.

Figure 12A:
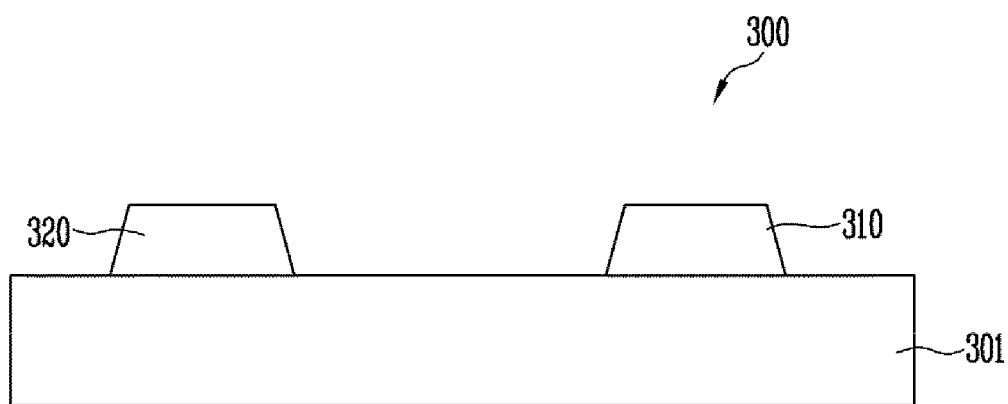
FIG. 12A, FIG. 12B, FIG. 12C, and FIG. 12D are sequential cross-sectional views illustrating a manufacturing method of a light-emitting device according to an exemplary embodiment of the inventive concepts.
Figure 12B:
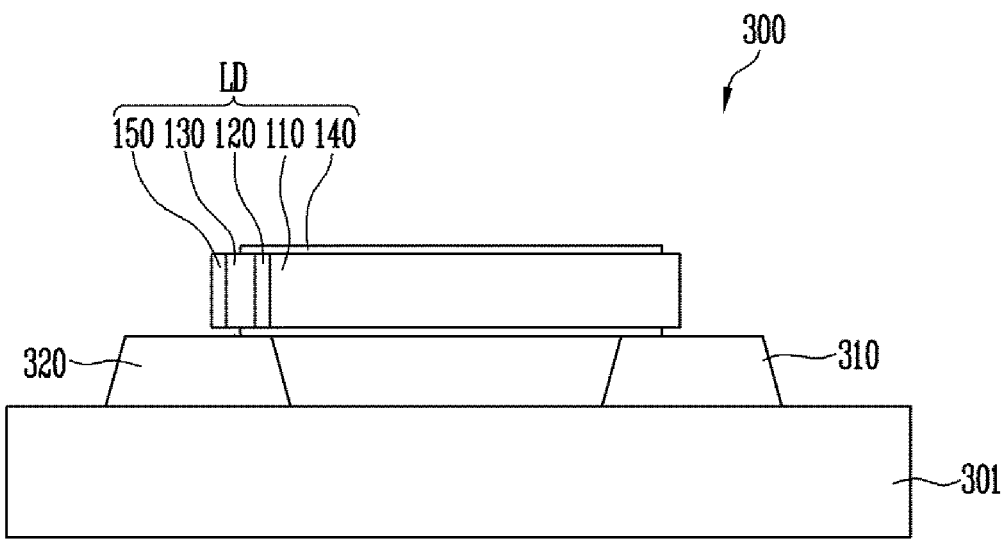

Referring to FIG. 12A to FIG. 12B, a first electrode 310 and a second electrode 320 are disposed (or formed) on a substrate 301 to be separated from each other, and a plurality of rod-shaped LEDs LD are aligned between the first electrode 310 and the second electrode 320. For example, an LED solution is applied to each unit light-emitting area 300 on which the first electrode 310 and the second electrode 320 are disposed, and an electric field is applied thereto, thereby aligning the plurality of rod-shaped LEDs LD between the first electrode 310 and the second electrode 320.

Figure 12C:
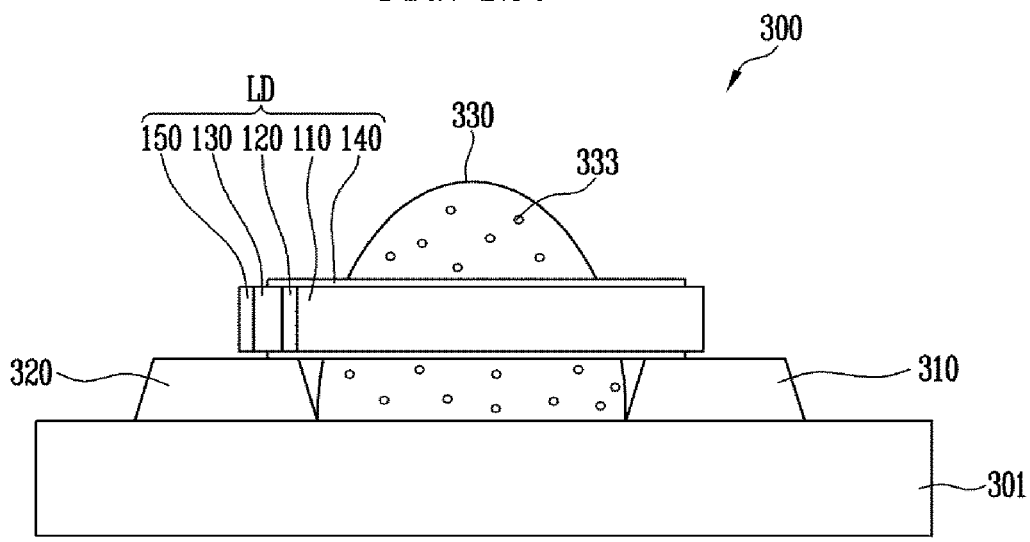

Referring to FIG. 12C, a light-transmitting structure 330 is disposed (or formed) between the first electrode 310 and the second electrode 320 to overlap at least one region of the rod-shaped LEDs LD. In some exemplary embodiments, the step of providing the light-transmitting structure 330 may include the step of applying a liquid organic insulating material between the first electrode 310 and the second electrode 320 to expose opposite ends of the plurality of rod-shaped LEDs LD, and to overlap liquid organic insulating material with at least one region (e.g., the center part) of the rod-shaped LEDs LD, and the step of applying light and/or heat to the liquid organic insulating material and hardening it to thereby provide (or form) the light-transmitting structure 330.

In some exemplary embodiments, a plurality of scatterers 333 may be distributed into the liquid organic insulating material that is applied between the first electrode 310 and the second electrode 320. As described above, the organic insulating material in which the scatterers 333 are distributed is applied above the height of the rod-shaped LEDs LD and is then hardened, thereby providing (or forming) the light-transmitting structure 330 according to the exemplary embodiment of the inventive concepts.

Figure 12D:
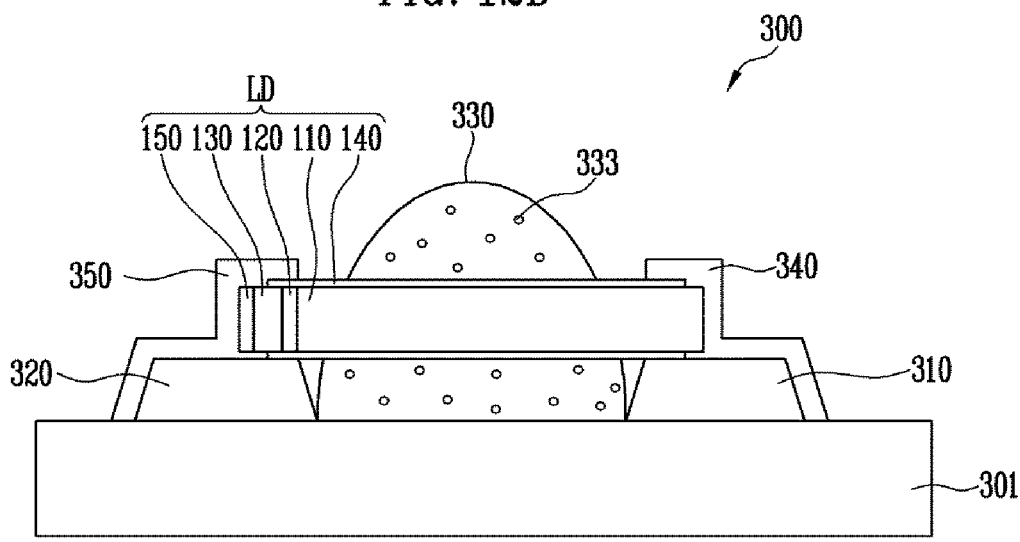

Referring to FIG. 12D, reflective contact electrodes 340 and 350 are disposed (or formed) at opposite ends of the rod-shaped LEDs LD, thereby electrically connecting the rod-shaped LEDs LD between the first electrode 310 and the second electrode 320. For example, the first contact electrode 340 is disposed (or formed) on one end of the rod-shaped LEDs LD that is disposed on the first electrode 310, and the second contact electrode 350 is then disposed (or formed) on the other end of the rod-shaped LEDs LD that is disposed on the second electrode 320, such that the opposite ends of the rod-shaped LEDs LD can be respectively electrically connected to the first electrode 310 and the second electrode 320.

According to the exemplary embodiments of the inventive concepts as described above, the reflective contact electrodes 340 and 350 and the light-transmitting structure 330 are disposed (or formed) in each unit light-emitting areas 300 for providing (or forming) the light-emitting device. Correspondingly, the light-emitting device uniformly emitting light in each unit light-emitting area 300 and the manufacturing method of the light-emitting device may be provided. That is, according to the exemplary embodiments of the inventive concepts, in the light-emitting device including the plurality of rod-shaped LEDs LD, uniformity can be achieved in terms of light emission.

Although the technical idea of the inventive concepts has been specifically described in accordance with the above-described embodiments, it should be noted that the above-described exemplary embodiments are intended to be illustrative and not restrictive. It will be apparent to those skilled in the art that various modifications may be made without departing from the scope of the inventive concepts.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A light-emitting device, comprising:
    a base layer;
    a first electrode and a second electrode disposed on the base layer;
    a light-emitting diode (LED) disposed on the base layer, the LED having a first end on the first electrode and a second end on the second electrode opposite to the first end; and
    a light-transmitting structure disposed on the LED, wherein the light-transmitting structure is disposed between the first electrode and the second electrode such that the light-transmitting structure does not overlap a distal end of the first electrode that faces away from a center of the LED and overlap a distal end of the second electrode that faces away from a center of the LED from plan view.

2. The light-emitting device of claim 1, further comprising:
    a third electrode partially overlapping the first electrode on a plan view and electrically connected to the first end of the LED; and
    a fourth electrode partially overlapping the second electrode on the plan view and electrically connected to the second end of the LED.

3. The light-emitting device of claim 2, wherein
    the first end of the LED is disposed between the first electrode and the third electrode, and
    the second end of the LED is disposed between the second electrode and the fourth electrode.

4. The light-emitting device of claim 3, wherein the light-transmitting structure is disposed between the third electrode and the fourth electrode.

5. The light-emitting device of claim 3, wherein the first and second electrodes are disposed on a same layer.

6. The light-emitting device of claim 1, wherein the light-transmitting structure is disposed between the first electrode and the second electrode such that the light-transmitting structure does not overlap a distal end of the first electrode that faces towards the center of the LED and overlap a distal end of the second electrode that faces towards the center of the LED from plan view.

7. The light-emitting device of claim 1, wherein the light-transmitting structure comprises scatterers.

8. The light-emitting device of claim 7, wherein the scatterers include at least one of $TiO_2$ and $SiO_2$.

9. The light-emitting device of claim 8, wherein the light-transmitting structure further comprises a silicone resin within which the scatterers are distributed.

10. The light-emitting device of claim 1, wherein the LED comprises:

a first semiconductor layer in the first end;
a second semiconductor layer in the second end; and
an active layer between the first semiconductor layer and the second semiconductor layer in a direction parallel to the base layer.

11. The light-emitting device of claim 1, wherein the light-transmitting structure has a top surface with a dome shape.

12. The light-emitting device of claim 1, wherein the light-transmitting structure has a top surface with a rough surface in the form of protrusions and depressions.

13. The light-emitting device of claim 1, wherein the light-transmitting structure does not directly contact either of the first electrode or the second electrode.

14. The light-emitting device of claim 1, wherein the light-transmitting structure extends directly below a center of the LED.

* * * * *